(12) United States Patent
Doornbos et al.

(10) Patent No.: US 12,238,914 B2
(45) Date of Patent: Feb. 25, 2025

(54) HETEROSTRUCTURE OXIDE SEMICONDUCTOR VERTICAL GATE-ALL-AROUND (VGAA) TRANSISTOR AND METHODS FOR MAKING THE SAME

(71) Applicant: Taiwan Semiconductor Manufacturing Company Limited, Hsinchu (TW)

(72) Inventors: Gerben Doornbos, Kessel-Lo (BE); Blandine Duriez, Brussels (BE); Marcus Johannes Henricus Van Dal, Linden (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/309,013

(22) Filed: Apr. 28, 2023

(65) Prior Publication Data
US 2023/0262953 A1    Aug. 17, 2023

Related U.S. Application Data

(62) Division of application No. 17/216,161, filed on Mar. 29, 2021, now Pat. No. 11,672,110.

(60) Provisional application No. 63/031,744, filed on May 29, 2020.

(51) Int. Cl.
*H01L 29/786*    (2006.01)
*H01L 29/06*    (2006.01)
(Continued)

(52) U.S. Cl.
CPC ....... *H10B 12/033* (2023.02); *H01L 29/0673* (2013.01); *H01L 29/225* (2013.01);
(Continued)

(58) Field of Classification Search
CPC .... H10B 12/033; H10B 12/30; H10B 12/315; H10B 12/482; H10B 61/22; H10B 63/34;
(Continued)

(56) References Cited

U.S. PATENT DOCUMENTS 10,083,871 B2 *  9/2018  Cheng ................ H01L 27/0886
2003/0227072 A1  12/2003  Forbes et al.
(Continued)

FOREIGN PATENT DOCUMENTS

KR    20050010963 A    3/2005
KR    20080039125 A    5/2008
(Continued)

OTHER PUBLICATIONS

Chinese Patent Office; Application No. 202110603926.X; First Office Action mailed Jun. 21, 2023, 12 pages.
(Continued)

*Primary Examiner* — Cuong B Nguyen
(74) *Attorney, Agent, or Firm* — The Marbury Law Group, PLLC

(57) ABSTRACT

A method of forming a semiconductor device includes forming a contact metal layer, forming a channel structure on the contact metal layer, wherein the channel structure comprises a first source/drain region, a channel region and a second source/drain region stacked in that order, and forming a gate structure around the channel region, such that an upper surface of the gate structure is substantially coplanar with an upper surface of the channel structure.

20 Claims, 34 Drawing Sheets

(51) Int. Cl.
   *H01L 29/225* (2006.01)
   *H01L 29/66* (2006.01)
   *H01L 29/78* (2006.01)
   *H10B 12/00* (2023.01)

(52) U.S. Cl.
   CPC ...... *H01L 29/66742* (2013.01); *H01L 29/785* (2013.01); *H01L 29/78642* (2013.01); *H01L 29/7869* (2013.01); *H01L 29/78696* (2013.01); *H10B 12/30* (2023.02); *H10B 12/315* (2023.02); *H10B 12/482* (2023.02); *H01L 2029/7858* (2013.01)

(58) Field of Classification Search
   CPC ... H10B 61/20; H01L 29/0673; H01L 29/225; H01L 29/66742; H01L 29/785; H01L 29/78642; H01L 29/7869; H01L 29/78696; H01L 2029/7858; H01L 29/66969; H01L 29/7827; H01L 29/1033; H01L 29/24; H01L 29/42376; H01L 29/42392; H01L 29/66666
   See application file for complete search history.

(56) References Cited

U.S. PATENT DOCUMENTS

| | | |
|---|---|---|
| 2015/0263074 A1 | 9/2015 | Takaki |
| 2017/0338334 A1 | 11/2017 | Cheng et al. |
| 2019/0067437 A1 | 2/2019 | Ramaswamy et al. |
| 2020/0006350 A1 | 1/2020 | Huang et al. |
| 2020/0220023 A1 | 7/2020 | Pillarisetty et al. |
| 2021/0335789 A1 | 10/2021 | Zhu |

FOREIGN PATENT DOCUMENTS

| | | |
|---|---|---|
| KR | 20090022764 A | 3/2009 |
| KR | 20090054686 A | 6/2009 |
| KR | 101368191 B1 | 2/2014 |
| KR | 20150097500 A | 8/2015 |
| KR | 20160002306 A | 1/2016 |
| KR | 20170122660 A | 11/2017 |
| KR | 20200036950 A | 4/2020 |
| TW | 201108418 A | 3/2011 |
| TW | 201727915 A | 8/2017 |
| WO | 2019135753 A1 | 7/2019 |
| WO | 2020042255 A1 | 3/2020 |

OTHER PUBLICATIONS

Taiwan Patent Office; Application No. 110118885 Office Action mailed Jun. 20, 2022, 7 pages.
Korean Patent Office; Application No. 10-2021-0069424 Office Action mailed Aug. 11, 2022, 5 pages.
Korean Patent and Trademark Office, Application No. 10-2021-0069424, First Examination Report mailed Jan. 14, 2023, 4 pages.

* cited by examiner

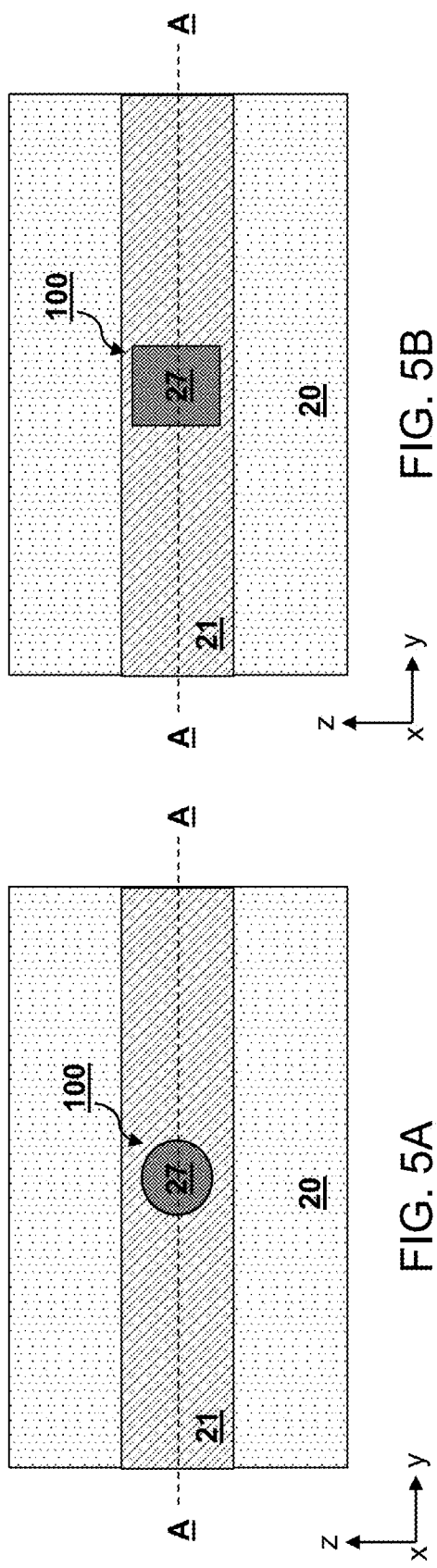
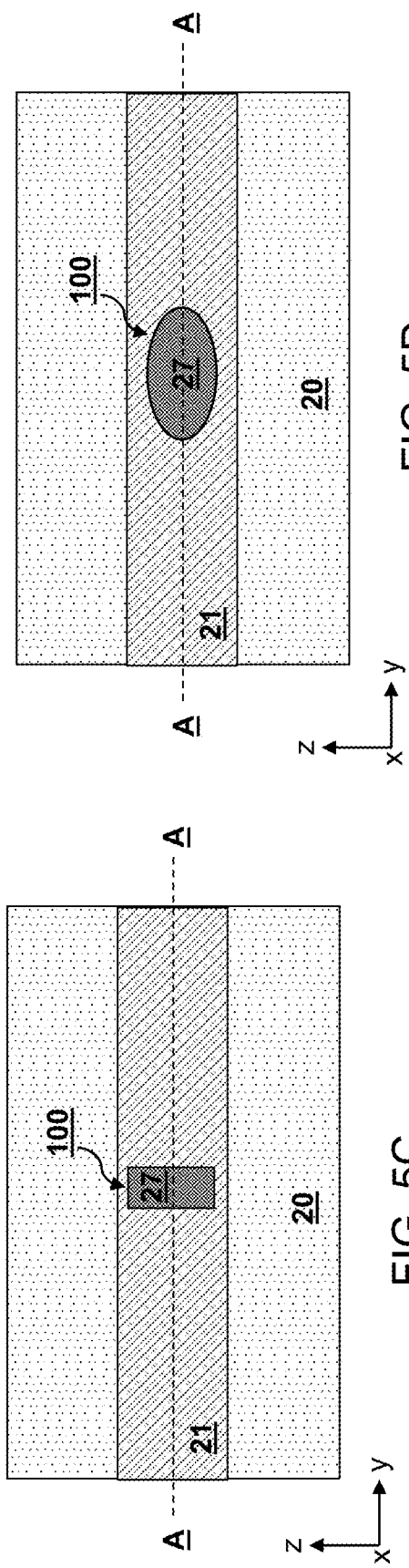
FIG. 5A
FIG. 5B
FIG. 5C
FIG. 5D

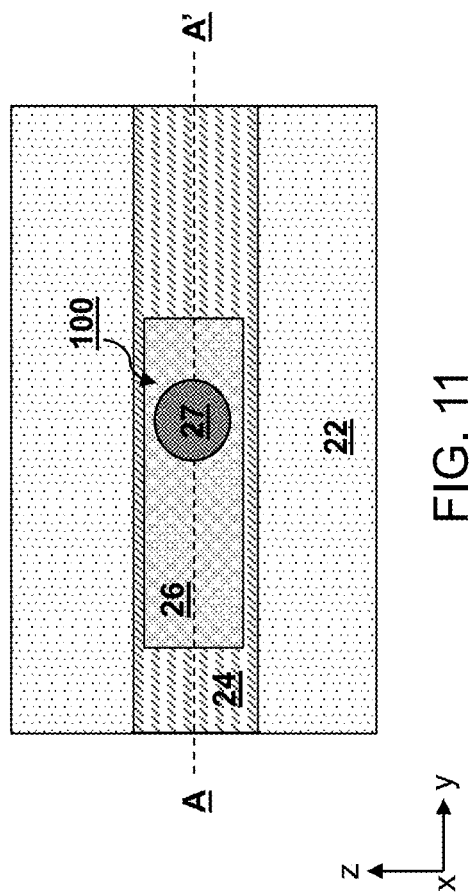
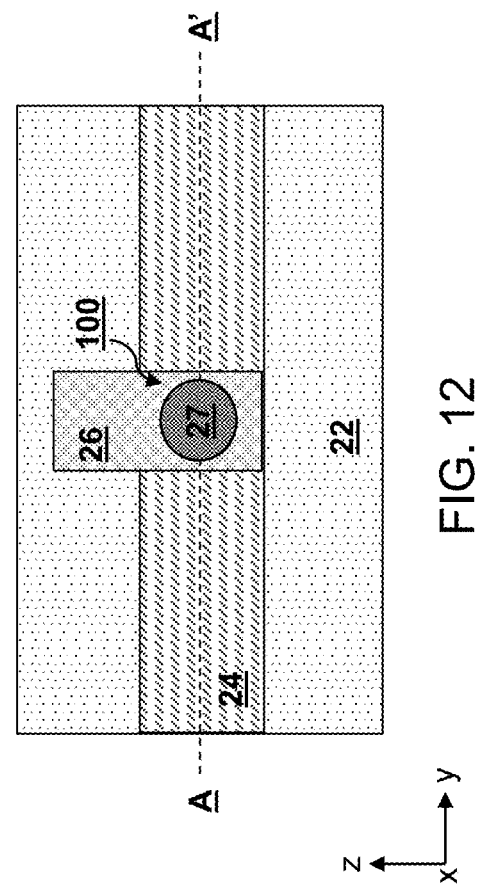

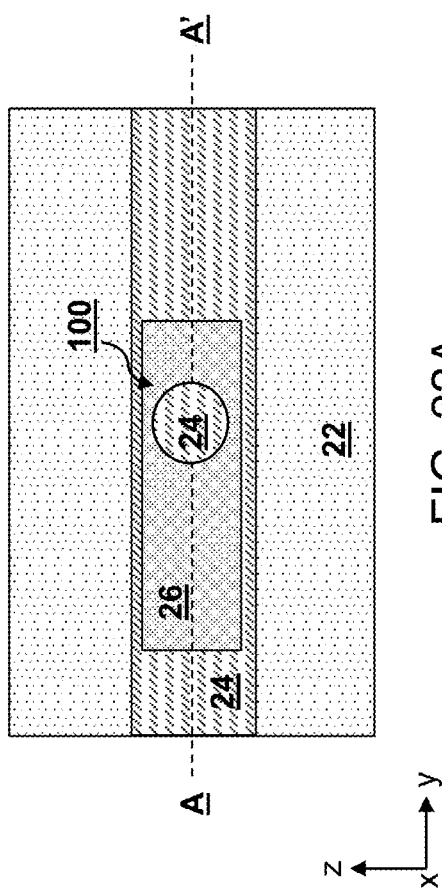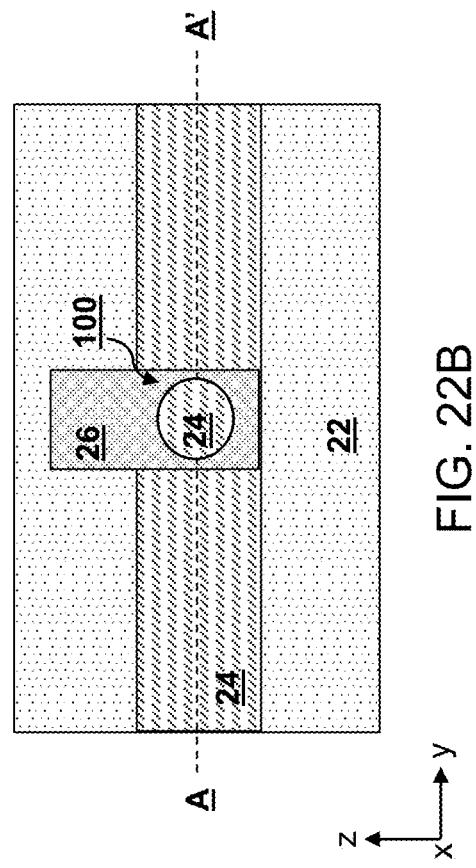

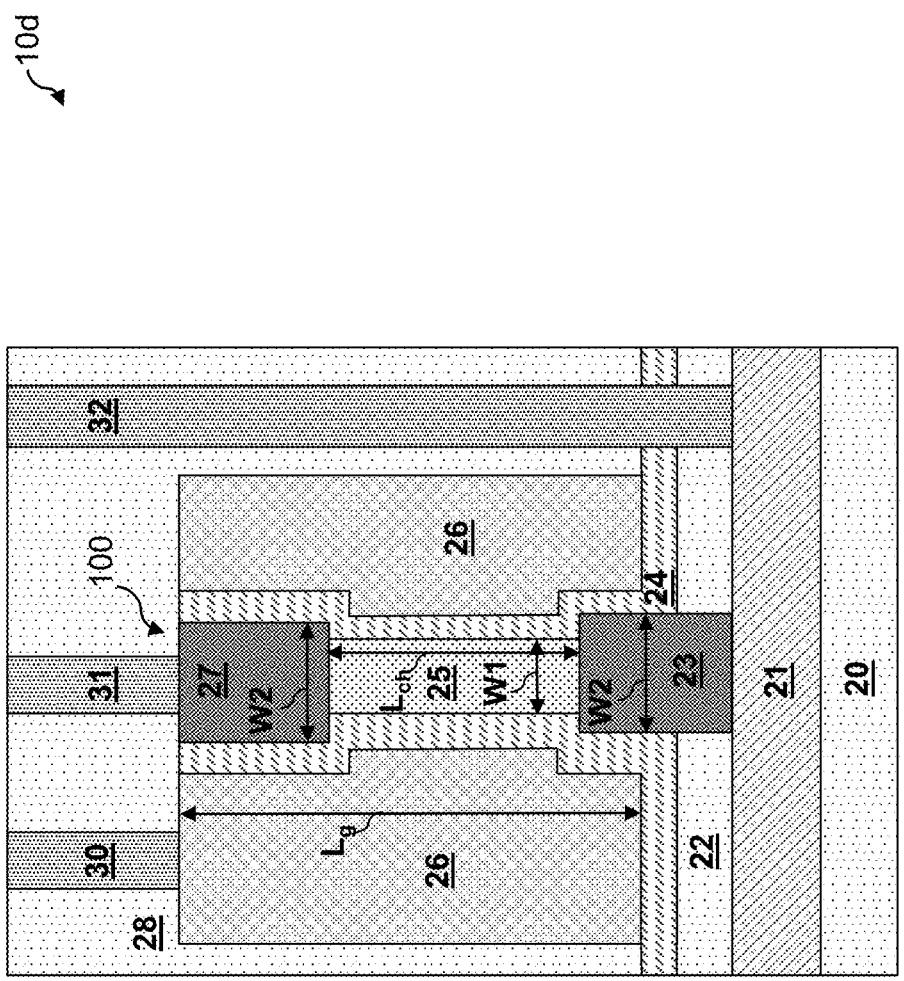
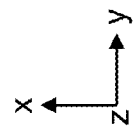
FIG. 28

HETEROSTRUCTURE OXIDE
SEMICONDUCTOR VERTICAL
GATE-ALL-AROUND (VGAA) TRANSISTOR
AND METHODS FOR MAKING THE SAME

RELATED APPLICATIONS

This application is a divisional application of U.S. patent application Ser. No. 17/216,161, entitled "Heterostructure Oxide Semiconductor Vertical Gate-All-Around (VGAA) Transistor and Methods for Making the Same" filed on Mar. 29, 2021, which claims priority to U.S. Provisional Patent Application No. 63/031,744 entitled "Heterostructure Oxide Semiconductor Vertical Gate-All-Around (VGAA) Transistor" filed on May 29, 2020, the entire contents of both of which are hereby incorporated by reference for all purposes.

BACKGROUND

Advances in integrated circuit (IC) manufacturing, and specifically semiconductor device manufacturing, are making many different types of memory devices available for use in logic chip designs. As examples, memory devices may include magnetoresistive random-access memory (MRAM) devices, resistive random-access memory (RRAM) devices, phase-change random-access memory (PCRAM) devices, etc. Semiconductor device manufacturing generally may be categorized into front-end-of-the line (FEOL), middle-of-the-line (MOL), and back-end-of-the-line (BEOL) processes. Generally, in current semiconductor manufacturing, certain elements, such as access (or selector) transistors, are formed in the FEOL processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D are top-down views of the exemplary structure of FIG. 4 showing different shapes of the channel structure suitable for use in various embodiments. The vertical plane A-A is the plane of the vertical cross-section of FIG. 4.

FIG. 11 is a top-down view of the exemplary structure of FIG. 10 showing a first orientation of the gate structure suitable for use in various embodiments. The vertical plane A-A is the plane of the vertical cross-section of FIG. 10.

FIG. 12 is a top-down view of the exemplary structure of FIG. 10 showing a second orientation of the gate structure suitable for use in various embodiments. The vertical plane A-A is the plane of the vertical cross-section of FIG. 10.

FIG. 22A is a top-down view of the exemplary structure of FIG. 21 showing the first orientation of the gate structure suitable for use in various embodiments. The vertical plane A-A is the plane of the vertical cross-section of FIG. 21.

FIG. 22B is a top-down view of the exemplary structure of FIG. 21 showing the second orientation of the gate structure suitable for use in various embodiments. The vertical plane A-A is the plane of the vertical cross-section of FIG. 21.

FIG. 28 is a vertical cross-sectional view of an exemplary transistor.

DETAILED DESCRIPTION

Figure 1:
FIG. 1 is a vertical cross-sectional view of the exemplary structure after formation of an interlayer dielectric (ILD) layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to a memory access or selector device having a channel region and source/drain regions stacked along a same direction, methods of manufacturing the same, and methods of operating the same.

Semiconductor device manufacturing generally may be categorized into front-end-of-the line (FEOL), middle-of-the-line (MOL), and back-end-of-the-line (BEOL) processes. Generally, in current semiconductor manufacturing, certain elements, such as access (or selector) transistors, are formed in the FEOL processes. Some memory devices, such as MRAM devices, RRAM devices, PCRAM devices, etc., may be created by building a memory array in BEOL processes. Such memory devices built in the BEOL processes often require an access (or selector) transistor to enable selection of a cell in the memory array for reading/writing. However, as access (or selector) transistors are generally formed in the FEOL processes in current semiconductor manufacturing, access (or selector) transistors may not be available for memory devices, such as MRAM devices, RRAM devices, PCRAM devices, etc., created by building a memory array in BEOL processes. Additionally, in current semiconductor manufacturing, access (or selector) transistors are generally formed horizontally and are planar (i.e., current flows in-plane) while memory devices, such as MRAM devices, RRAM devices, PCRAM devices, etc., are often vertical (i.e., current flow out-of-plane) in nature. As such, a vertical transistor, such as a vertical transistor manufactured in BEOL processes, is needed to support improvements in logic chips, such as logic chips employing MRAM devices, RRAM devices, PCRAM devices, etc.

According to an embodiment of the present disclosure, a semiconductor device may include a channel structure arranged in a first direction with a gate structure surrounding the channel structure. The channel structure may include a stacked nanowire structure, such as a stacked Indium-Gallium-Zinc-Oxide (IGZO)/Indium-Tin-Oxide (ITO) nanowire structure or other suitable stacked material nanowire structure, stacked up along the first direction. The stacked nanowire structure may be configured such that current may flow in the first direction. The semiconductor device may be a semiconductor transistor that may be connected (e.g., in series or in parallel) to a memory element, such as a magnetic tunnel junction (MTJ), a giant magnetoresistance (GMR) device, or any other suitable spintronic-logic device. The semiconductor device of various embodiments may be a semiconductor transistor formed during a BEOL process.

The semiconductor device of various embodiments of the present disclosure includes a vertical thin-film transistor having a vertically arranged channel structure with a gate structure surrounding the channel structure. The channel structure may include a stacked ITO/IGZO/ITO nanowire structure configured such that the current flows out-of-plane (e.g., vertically). The transistor may be connected in series with a memory element, such as a MTJ, which may improve the memory density.

Various embodiments of the present disclosure may provide a hetero-structure vertical nanowire transistor, such as a thin-film transistor (TFT), where source and drain may be a first material, such as ITO or any other suitable material, and the channel may be a second material, such as IGZO or any other suitable material. Various embodiments of the present disclosure may provide a vertical nanowire transistor, where source, drain, and channel may all be the same material, such as ITO, IGZO, or any other suitable material. The TFT of the various embodiments may be fabricated in a BEOL process.

The semiconductor device, such as a memory device, of the various embodiments of the present disclosure may include a memory element and a transistor connected in series and stacked up along a first direction. The transistor may include a channel structure including a channel region and source/drain regions located on two sides of the channel region. The channel region and the source/drain regions may be stacked up along the first direction. The transistor may include a gate structure surrounding the channel structure. The transistor may include a first contact structure disposed on a bottom surface of the channel structure and connected to one of the source/drain regions. The transistor may include a second contact structure disposed on a top surface of the channel structure and connected to one of the source/drain regions. The gate structure may be located in between the first contact structure and the second contact structure.

FIG. 1 is a vertical cross-sectional view of the exemplary structure after formation of an interlayer dielectric (ILD) layer 20. The ILD layer 20 may be formed from an ILD material such as undoped silicate glass, a doped silicate glass, organosilicate glass, or a porous dielectric material. Other suitable materials for use as the ILD layer 20 are within the contemplated scope of the disclosure. The ILD layer 20 may be formed by any deposition process, such as chemical vapor deposition, spin-coating, physical vapor deposition (PVD) (also referred to as sputtering), atomic layer deposition (ALD), etc. The ILD layer 20 may be formed as part of a BEOL process. As examples, as the ILD layer 20 may be formed as part of a BEOL process, the ILD layer 20 may be located in an interconnect, above a complementary metal-oxide-semiconductor (CMOS) transistor, below a CMOS transistor, etc.

Figure 2:
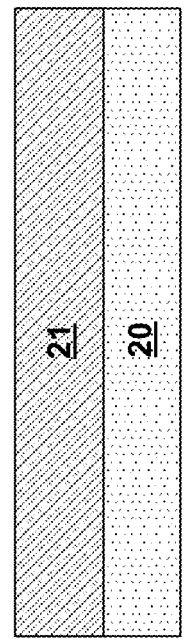
FIG. 2 is a vertical cross-sectional view of the exemplary structure after formation of a contact metal layer over the ILD layer.

FIG. 2 is a vertical cross-sectional view of the exemplary structure after formation of a contact metal layer 21 over the ILD layer 20. The contact metal layer 21 may be formed on top of the ILD layer 20 in a direction, such as the x-direction illustrated in FIG. 2. In this manner the contact metal layer 21 may be stacked up along the x-direction with the ILD layer 20. The contact metal layer 21 may be formed from Copper (Cu), Cobalt (Co), Ruthenium (Ru), Tungsten (W), Titanium (Ti), Tantalum (Ta), Titanium Nitride (TiN), Tantalum Nitride (TaN), or combinations thereof. Other suitable materials for use as the contact metal layer 21 are within the contemplated scope of the disclosure. The contact metal layer 21 may be formed by a conformal or non-conformal deposition process, such as PVD, ALD, etc. The thickness of the contact metal layer 21 may be in a range from 2 nm to 40 nm, such as from 4 nm to 20 nm, although lesser and greater thicknesses may also be used.

Figure 3:
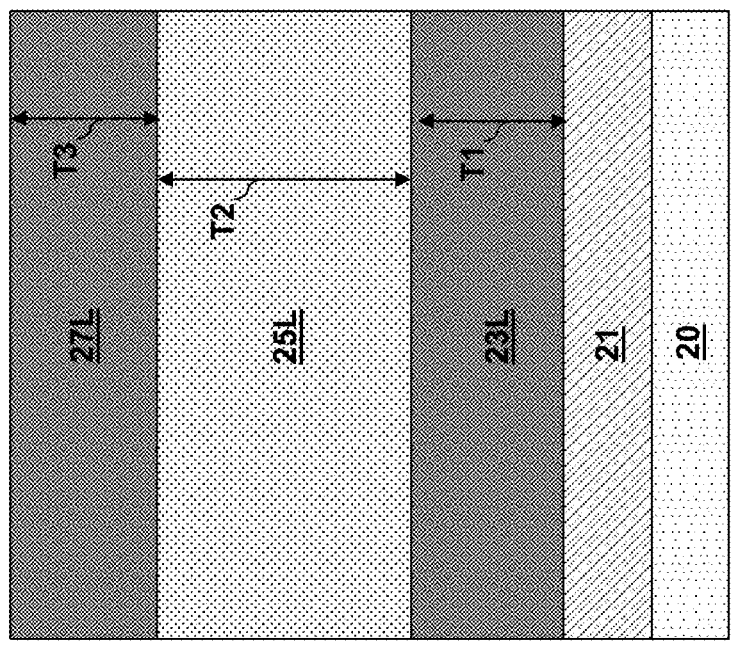
FIG. 3 is a vertical cross-sectional view of the exemplary structure after formation of oxide semiconductor layers over the contact metal layer.

FIG. 3 is a vertical cross-sectional view of the exemplary structure after formation of oxide semiconductor layers 23L, 25L, 27L over the contact metal layer 21. The oxide semiconductor layers 23L, 25L, 27L may comprise an oxide semiconductor layer stack. The oxide semiconductor layers 23L, 25L, 27L may be formed in three layers stacked up in the x-direction as illustrated in FIG. 2, such that one layer 23L is a bottom layer deposited on the contact metal layer 21, a second layer 25L is a middle layer deposited on the bottom layer 23L, and the third layer 27L is a top layer deposited on the middle layer 25L. The second layer 25L may separate the bottom layer 23L from the top layer 27L. The oxide semiconductor layers 23L, 25L, 27L may be deposited sequentially on top of one another in the x-direction such that layer 23L is deposited first, layer 25L is deposited second, and layer 27L is deposited third. The oxide semiconductor layers 23L, 25L, 27L may be formed by a conformal or non-conformal deposition process, such as PVD, ALD, etc. The oxide semiconductor layers 23L, 25L, 27L may be formed from Indium Gallium Zinc Oxide (IGZO), Indium Tin Oxide (ITO), Gallium Oxide (e.g., $Ga_2O_3$), or Indium Oxide (e.g., $In_2O_3$), Zinc Oxide (e.g., ZnO). Other suitable materials for use as the oxide semiconductor layers 23L, 25L, 27L are within the contemplated scope of the disclosure. The oxide semiconductor layers 23L, 25L, 27L may deposited in respective thicknesses T1, T2, and T3. In some embodiments, thickness T1 of the layer 23L and thickness T3 of the layer 27L may be the same. In some embodiments, thickness T1 of the layer 23L and thickness T3 of the layer 27L may be different. In some embodiments, the thickness T2 of layer 25L may be greater than the thickness T1 of layer 23L and the thickness T2 of layer 25L may be greater than the thickness T3 of layer 27L. The thickness T1 of the layer 23L may be in a range from 5 nm to 80 nm, such as from 10 nm to 40 nm, although lesser and greater thicknesses may also be used. The thickness T2 of the layer 25L may be in a range from 10 nm to 80 nm, such as from 20 nm to 40 nm, although lesser and greater thicknesses may also be used. The thickness T3 of the layer 27L may be in a range from 5 nm to 80 nm, such as from 10 nm to 40 nm, although lesser and greater thicknesses may also be used.

As one specific example of the compositions of the oxide semiconductor layers 23L, 25L, 27L, the layer 23L may be formed from ITO, the layer 25L may be formed from IGZO, and the layer 27L may be formed from ITO. As further specific examples of the compositions of the oxide semiconductor layers 23L, 25L, 27L, the layers 23L and 27L may be formed from a semiconducting oxide that makes good contact to a metal, such as ITO, InZnO, or oxygen deficient (e.g., highly doped) IGZO, and the layer 25L may be formed from a material that makes a good low-leakage transistor, such as stoichiometric $InGaZnO_4$, $Ga_2O_3$, $In_2O_3$, or ZnO. As another specific example, of the compositions of the oxide semiconductor layers 23L, 25L, 27L, each of the oxide semiconductor layers 23L, 25L, 27L may be formed from IGZO where the composition in all three layers 23L, 25L, 27L is different. As another specific example, of the compositions of the oxide semiconductor layers 23L, 25L, 27L, each of the oxide semiconductor layers 23L, 25L, 27L may be formed from IGZO where the composition in the layers 23L, 27L is different than the composition in layer 25L.

Figure 4:
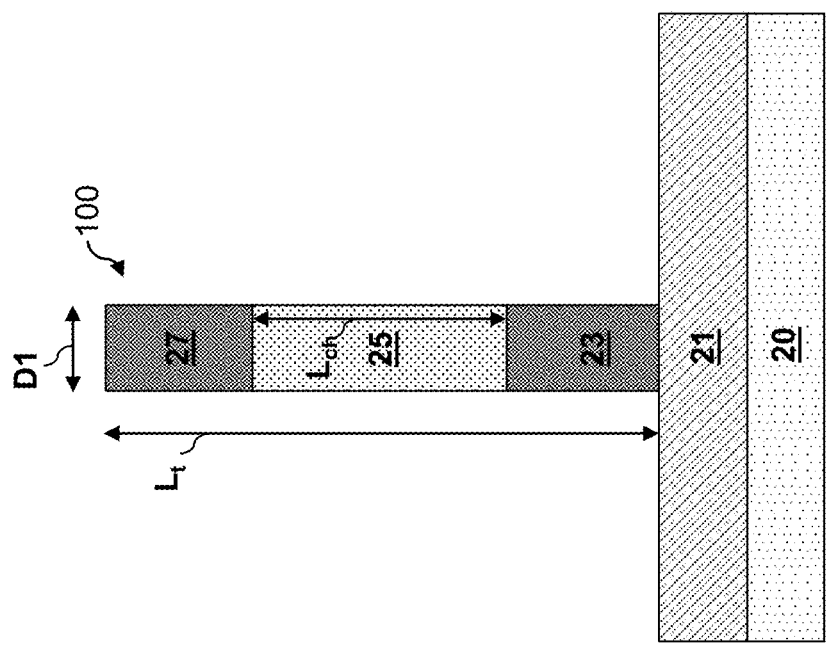
FIG. 4 is a vertical cross-sectional view of the exemplary structure after formation of a channel structure.

FIG. 4 is a vertical cross-sectional view of the exemplary structure after formation of a channel structure 100. The channel structure 100 may be formed by patterning or otherwise removing portions of the oxide semiconductor layer stack formed from the oxide semiconductor layers 23L, 25L, 27L to form a vertical structure in the x-direction. The patterning or removal of the material of the oxide semiconductor layers 23L, 25L, 27L may be performed in any suitable manner, such as via a masking and etching process, etc. The channel structure 100 may be a pillar extending in the stacked-up direction (e.g., a vertical pillar extending in the x-direction). The channel structure 100 may be formed from the oxide semiconductor layers 23L, 25L, 27L such that the channel structure 100 includes two source/drain regions 23, 27 located on respective sides of a channel region 25. The channel region 25 and the two source/drain regions 23, 27 may be stacked up along the same direction, such as the x-direction. The channel region 25 may be formed from the layer 25L and the two source/drain regions 23, 27 may be formed from the layers 23L and 27L, respectively.

The channel structure 100 may be a nanowire extending in the x-direction. In some embodiments, the channel structure 100 may be a pillar that is a cylindrical structure extending in the stacked-up direction. For example, FIG. 5A is a top-down view of the exemplary structure of FIG. 4 showing the channel structure 100 as a cylindrical nanowire having a circular cross-section. The vertical plane A-A is the plane of the vertical cross-section of FIG. 4. Additionally, the channel structure 100 may be a pillar with other cross-sections that are not circular. In some embodiments, the channel structure 100 may be a pillar that is a cuboid structure extending in the stacked-up direction. For example, FIG. 5B is a top-down view of the exemplary structure of FIG. 4 showing the channel structure 100 as a cuboid nanowire having a square cross-section. The vertical plane A-A is the plane of the vertical cross-section of FIG. 4. The corners of the square cross-section may or may not be rounded. As another example, FIG. 5C is a top-down view of the exemplary structure of FIG. 4 showing the channel structure 100 as a cuboid nanowire having a rectangular cross-section. The vertical plane A-A is the plane of the vertical cross-section of FIG. 4. The corners of the rectangular cross-section may or may not be rounded. In some embodiments, the channel structure 100 may be a pillar that is an oval-cross section structure extending in the stacked-up direction. For example, FIG. 5D is a top-down view of the exemplary structure of FIG. 4 showing the channel structure 100 as a nanowire having an oval cross-section. The vertical plane A-A is the plane of the vertical cross-section of FIG. 4. Other cross-sectional shapes are within the contemplated scope of the disclosure. For example, triangular or polygonal cross sections may be within the contemplated scope of disclosure.

Referring back to FIG. 4, the length $L_{ch}$ of the channel region 25 in the stacked-up direction (e.g., the x-direction) may be the same as the thickness T2 of the layer 25L. The length Lch may be in a range from 10 nm to 80 nm, such as from 20 nm to 40 nm, although lesser and greater thicknesses may also be used. The length ($L_t$) of the channel structure 100 in the stacked-up direction (e.g., the x-direction) may correspond to the total length of the two source/drain regions 23, 27 and the channel region 25. The diameter D1 of the channel structure 100 may be nominally uniform along the entire height of the channel structure 100. Said another way, the diameter D1 may be uniform along the stacked-up direction (e.g., the x-direction). The channel length $L_{ch}$ may be approximately three times (3×) the diameter D1.

Figure 6:
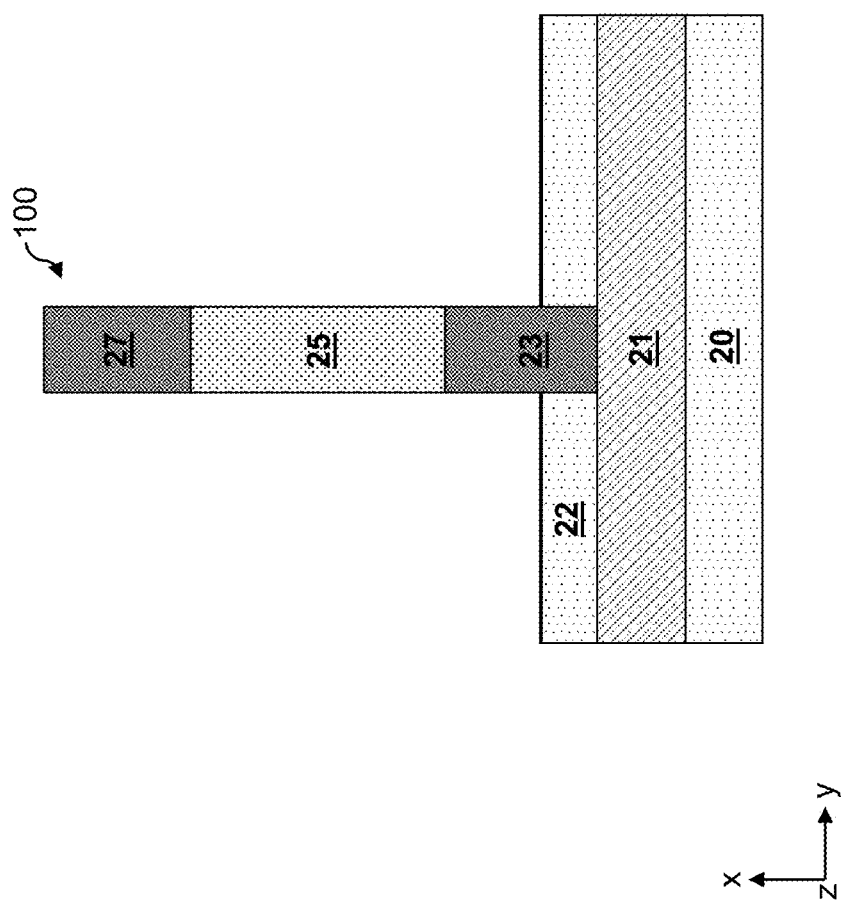
FIG. 6 is a vertical cross-sectional view of the exemplary structure after formation of a spacer oxide layer.

FIG. 6 is a vertical cross-sectional view of the exemplary structure after formation of a spacer oxide layer 22. The spacer oxide layer 22 may be formed on top of the contact metal layer 21 in a direction, such as the x-direction illustrated in FIG. 6. In this manner the spacer oxide layer 22 may be stacked up along the x-direction on top of the contact metal layer 21 and alongside/with the channel structure 100. The spacer oxide layer 22 may be formed from Silicon dioxide ($SiO_2$). Other suitable materials for use as the spacer oxide layer 22 are within the contemplated scope of the disclosure. The spacer oxide layer 22 may be formed by a conformal or non-conformal deposition process, such as PVD, ALD, etc. After the material for the spacer oxide layer 22 is deposited, the material for the spacer oxide layer 22 may be removed, such as by etching, to form the spacer oxide layer 22. The thickness of the spacer oxide layer 22 may be in a range from 2 nm to 20 nm, such as from 5 nm to 10 nm, although lesser and greater thicknesses may also be used. The spacer oxide layer 22 may be configured to act as an isolation layer to isolate the contact metal layer 21 from additional layers that will be built up on top of the spacer oxide layer 22.

Figure 7:
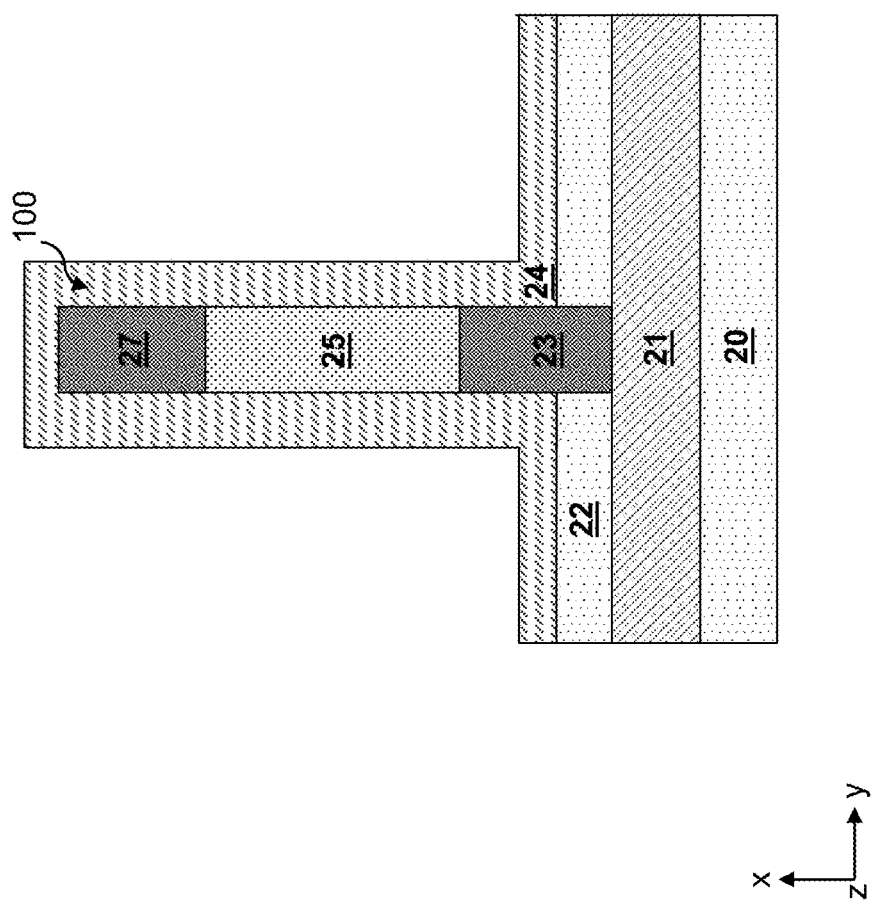
FIG. 7 is a vertical cross-sectional view of the exemplary structure after formation of dielectric layer.

FIG. 7 is a vertical cross-sectional view of the exemplary structure after formation of dielectric layer 24. The dielectric layer 24 may be formed on top of the channel structure 100 and spacer oxide layer 22 in a direction, such as the x-direction illustrated in FIG. 7. In this manner the dielectric layer 24 may be stacked up along the x-direction on top of the contact metal layer 21 and on top of the channel structure 100. The dielectric layer 24 may surround the channel structure 100. The dielectric layer 24 may be formed from a high-k dielectric material, such as $HfO_2$, $Al_2O_3$, HZO, $HfSiO_x$, $HfLaO_x$, etc. Other suitable materials for use as the dielectric layer 24 are within the contemplated scope of the disclosure. The dielectric layer 24 may be formed by a conformal deposition process, such as ALD. The thickness of the dielectric layer 24 may be in a range from 1 nm to 16 nm, such as from 2 nm to 8 nm, although lesser and greater thicknesses may also be used.

Figure 8:
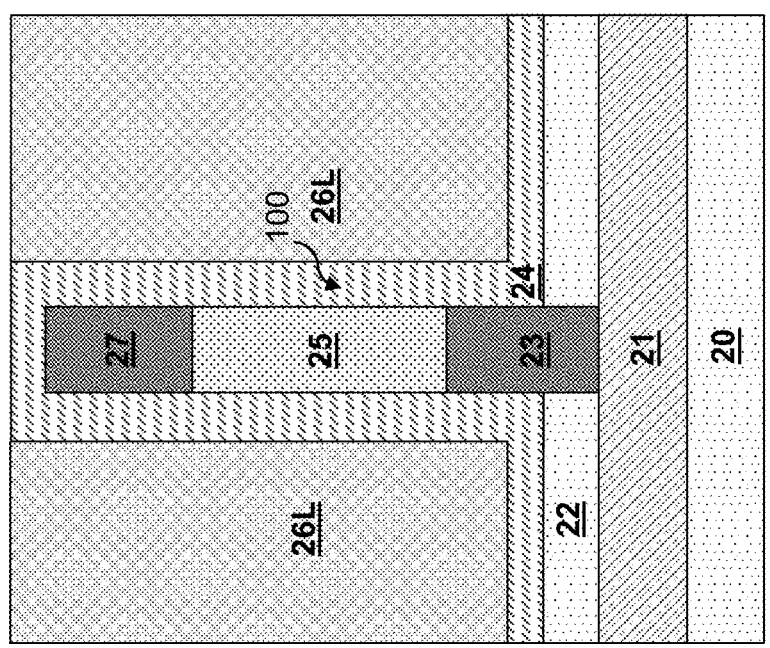
FIG. 8 is a vertical cross-sectional view of the exemplary structure after formation of a gate layer.

FIG. 8 is a vertical cross-sectional view of the exemplary structure after formation of a gate layer 26L. The gate layer 26L may be formed on top of the dielectric layer 24 in a direction, such as the x-direction illustrated in FIG. 8. In this manner the gate layer 26L may be stacked up along the x-direction on top of the dielectric layer 24 and surrounding the channel structure 100. In this manner, the dielectric layer 24 may be between the channel structure 100 and the gate layer 26L and the dielectric layer 24 may be between the gate layer 26L and the spacer oxide layer 22.

The gate layer 26L may be formed from a gate metal material, such as TiN, TaN, Ti, Ta, W, Titanium Aluminum (TiAl), etc. Other suitable materials for use as the gate layer 26L are within the contemplated scope of the disclosure. The gate layer 26L may be formed by a conformal or non-conformal deposition process, such as PVD, ALD, etc.

Figure 9:
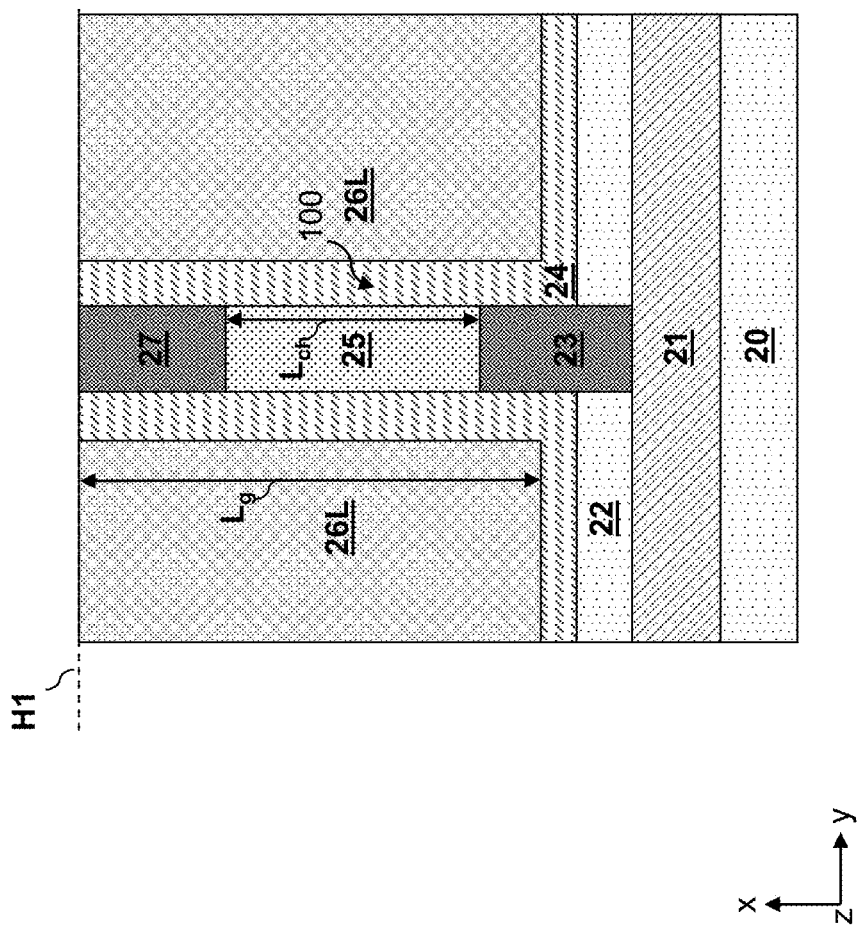
FIG. 9 is a vertical cross-sectional view of the exemplary structure after removal of gate material and dielectric material.

FIG. 9 is a vertical cross-sectional view of the exemplary structure after removal of gate material and dielectric material. FIG. 9 illustrates that material from both the gate layer 26L and dielectric layer 24 may be removed, such as by chemical-mechanical polishing (CMP) processes to render the gate layer 26L and dielectric layer 24 co-planar with a height H1 extending orthogonally from the stacked-up direction (e.g., in the y-direction). After removal of the gate material from the gate layer 26L, the gate layer 26L may have a length $L_g$ in the stacked-up direction (e.g., a length $L_g$ in the x-direction) that is greater than the length $L_{ch}$ of the channel region 25 in the stacked-up direction (e.g., the length $L_{ch}$ in the x-direction). The length $L_g$ of the gate layer 26L in the stacked-up direction (e.g., the length $L_g$ in the x-direction) of the gate layer 26L may range from 20 nm to 160 nm, such as from 40 nm to 80 nm, although lesser and greater lengths may also be used.

Figure 10:
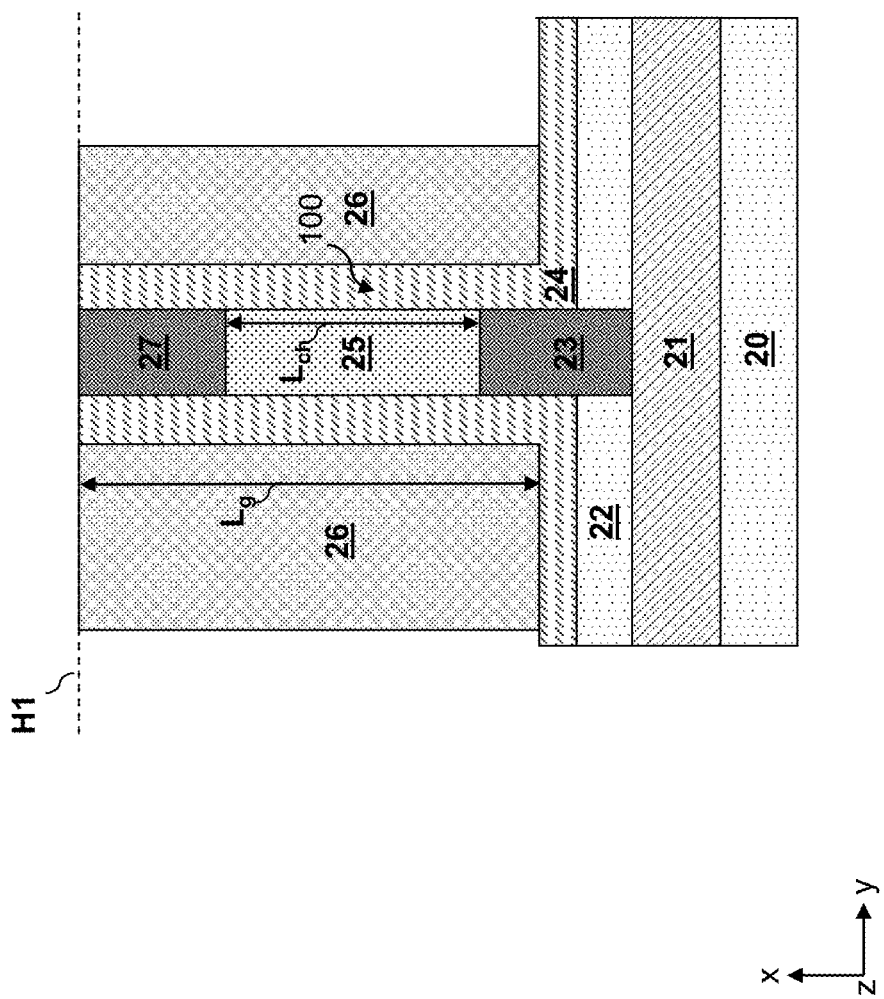
FIG. 10 is a vertical cross-sectional view of the exemplary structure after gate structure formation.

FIG. 10 is a vertical cross-sectional view of the exemplary structure after gate structure 26 formation. FIG. 10 illustrates that the final gate structure 26 may be formed by removal of the gate material from the gate layer 26L outboard of the dielectric layer 24 and channel structure 100 to expose at least a portion of the dielectric layer 24 above the spacer oxide layer 22. As an example, the gate material may be removed from the gate layer 26L by etching to form the gate structure 26. The gate structure 26 orientation may be in any direction about the stacked-up direction (e.g., in any orientation about the x-axis). The gate structure 26 orientation may be controlled by the mask placement for the gate structure 26 over the gate layer 26L, dielectric layer 24, and channel structure 100 before etching. The gate structure 26 orientation may be selected based on the desired orientation contacts to the gate structure 26 that may be selected for a desired finished transistor configuration. For example, FIG. 11 is a top-down view of the exemplary structure of FIG. 10 showing a first orientation of the gate structure 26 generally aligned in the y-direction. The vertical plane A-A' is the plane of the vertical cross-section of FIG. 10. As another example, FIG. 12 is a top-down view of the exemplary structure of FIG. 10 showing a second orientation of the gate structure 26 generally aligned in the z-direction. The vertical plane A-A' is the plane of the vertical cross-section of FIG. 10.

Figure 13:
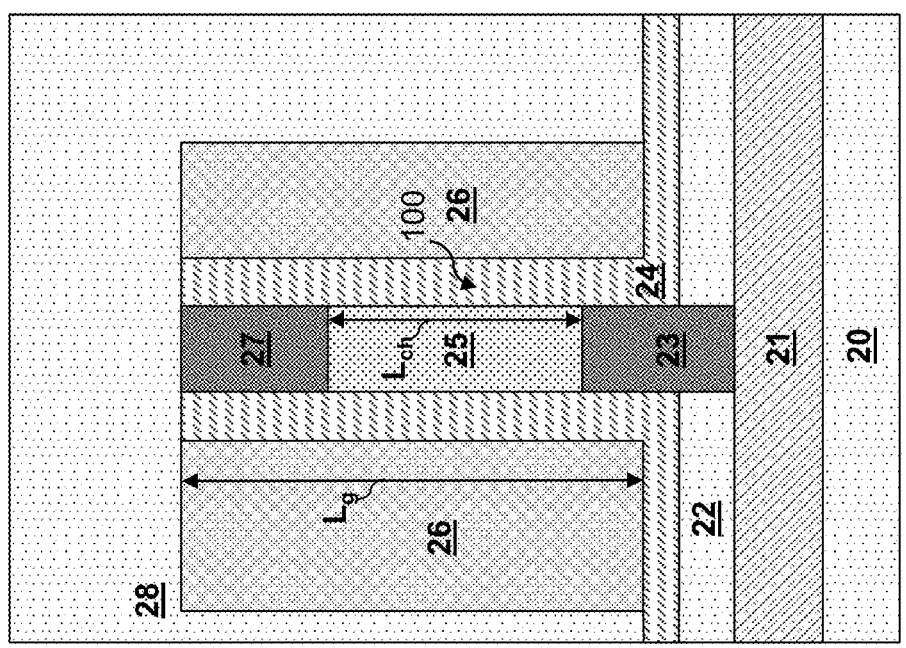
FIG. 13 is a vertical cross-sectional view of the exemplary structure after ILD layer formation.

FIG. 13 is a vertical cross-sectional view of the exemplary structure after ILD layer 28 formation. The ILD layer 28 may be formed from an ILD material such as undoped silicate glass, a doped silicate glass, organosilicate glass, or a porous dielectric material. Other suitable materials for use as the ILD layer 28 are within the contemplated scope of the disclosure. The ILD layer 28 may be formed by any deposition process, such as chemical vapor deposition, spin-coating, physical vapor deposition (PVD) (also referred to as sputtering), atomic layer deposition (ALD), etc. The ILD layer 28 may be planarized after it is deposited.

Figure 14:
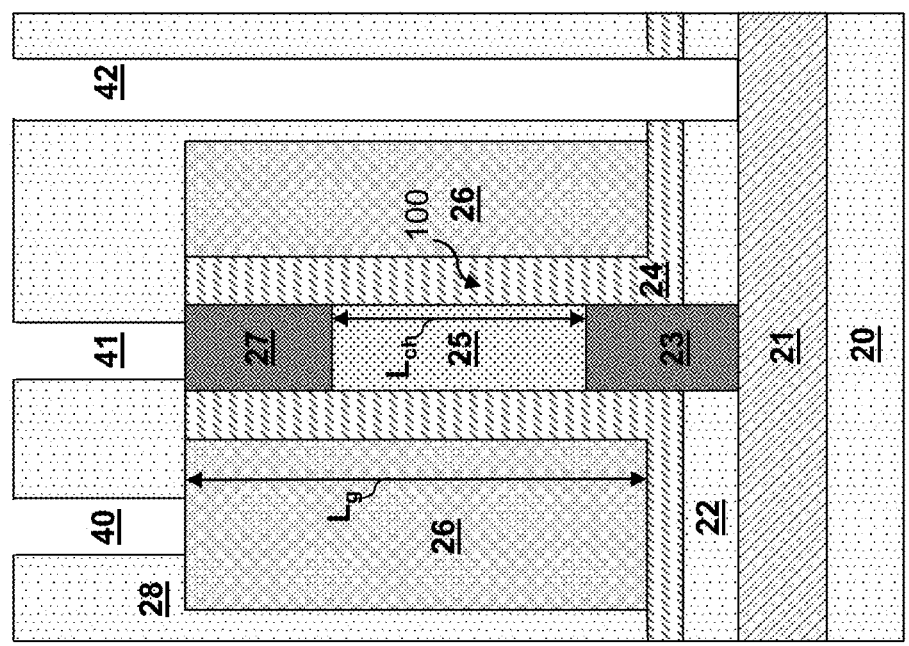
FIG. 14 is a vertical cross-sectional view of the exemplary structure after opening vias in the ILD layer in a first orientation suitable for use in various embodiments.

FIG. 14 is a vertical cross-sectional view of the exemplary structure after vias 40, 41, and 42 in the ILD layer 28 are formed in a first orientation. Via openings 40, 41, 42 may be formed through the ILD layer 28, the dielectric layer 24, and spacer oxide layer 22, for example, by applying and patterning a photoresist layer (not shown) over the ILD layer 28 and by transferring the pattern in the photoresist layer through the ILD layer 28, the dielectric layer 24, and spacer oxide layer 22 by performing an anisotropic etch process. Specifically, the photoresist layer may be patterned with discrete openings. Each discrete opening in the photoresist layer may overlap with, and may be located entirely within, an area of a portion of the gate structure 26, an area of a portion of the source/drain region 27, and an area of a portion of the contact metal layer 21. A top surface of the gate structure 26, a top surface of the source/drain region 27, and a top surface of the contact metal layer 21 may be physically exposed at the bottom of each via 40, 41, 42 opening. The photoresist layer is subsequently removed, for example, by ashing.

Figure 15:
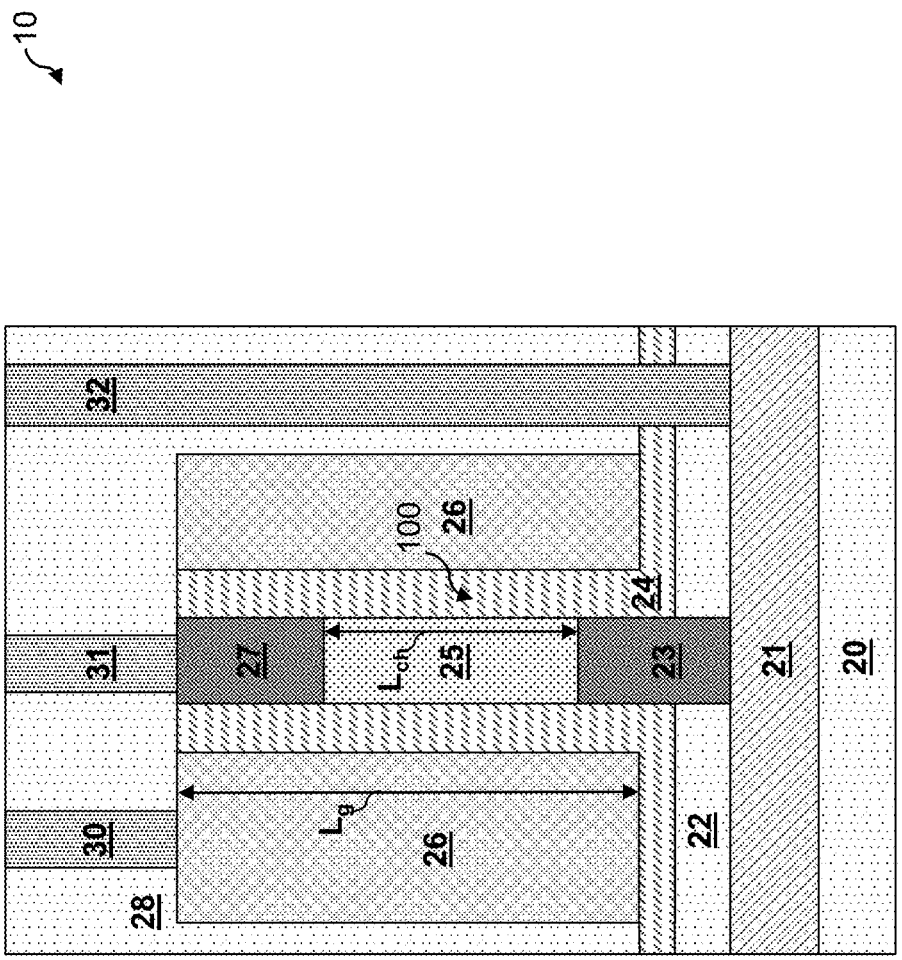
FIG. 15 is a vertical cross-sectional view of an exemplary transistor.

FIG. 15 is a vertical cross-sectional view of an exemplary transistor 10, such as a Vertical Gate All Around (VGAA) transistor. At least one conductive material, such as a metal, may be deposited in the via openings 40, 41, 42 to form contact structures 30, 31, and 32, and excess portions of the at least one conductive material may be removed from above the horizontal plane including the top surface of the ILD layer 28 by a planarization process (such as a chemical mechanical planarization process). The at least one conductive material may include a conductive metallic liner including a conductive metallic nitride (such as TiN, TaN, or WN) and a metallic fill material including an elemental metal (such as W, Co, Ru, or Mo) or an intermetallic alloy. Other suitable materials are within the contemplated scope of disclosure. Contact structure 30 may connect to the gate structure 26. Contact structure 31 may be disposed on the top surface of the channel structure 100 and connect to the source/drain region 27. Contact structure 32 may contact the contact metal layer 21. The contact metal layer 21 may be a contact structure disposed on the bottom surface of the channel structure 100 and connected to the source/drain region 23. The interface of the contact structure 32 to the contact metal layer 21 may enable the contact structure 32 and the contact metal layer 21 together to operate as a contact structure for the source/drain region 23. In the transistor 10, the length $L_{ch}$ of the channel region 25 of the channel structure 100 may be less than the length $L_g$ of the gate structure 26.

Figure 16:
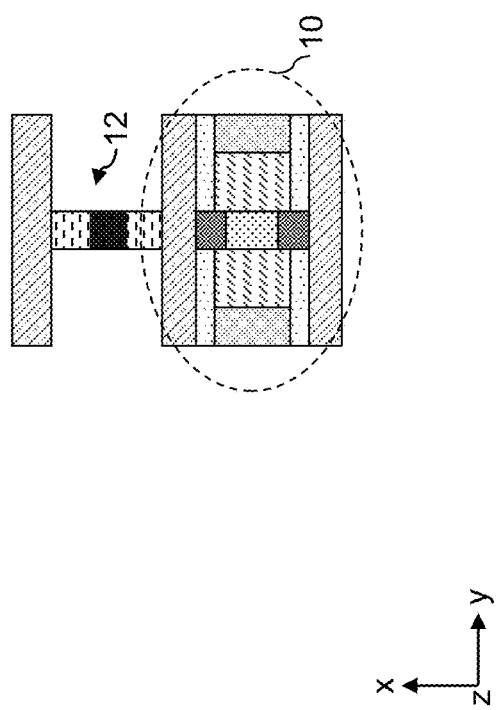
FIG. 16 is a vertical cross-sectional view of an exemplary transistor connected to a memory element in series.

FIG. 16 is a vertical cross-sectional view of the exemplary transistor 10 connected to a memory element 12 in series. The transistor 10 and memory element 12 may be stacked-up in the same direction (e.g., the x-direction). The transistor 10 may be connected below the memory element 12. The memory element 12 may be a MTJ type memory element, GMR type memory element, etc. The memory element 12 may be a memory element suitable for use in MRAM devices, RRAM devices, PCRAM devices, etc.

Figure 17:
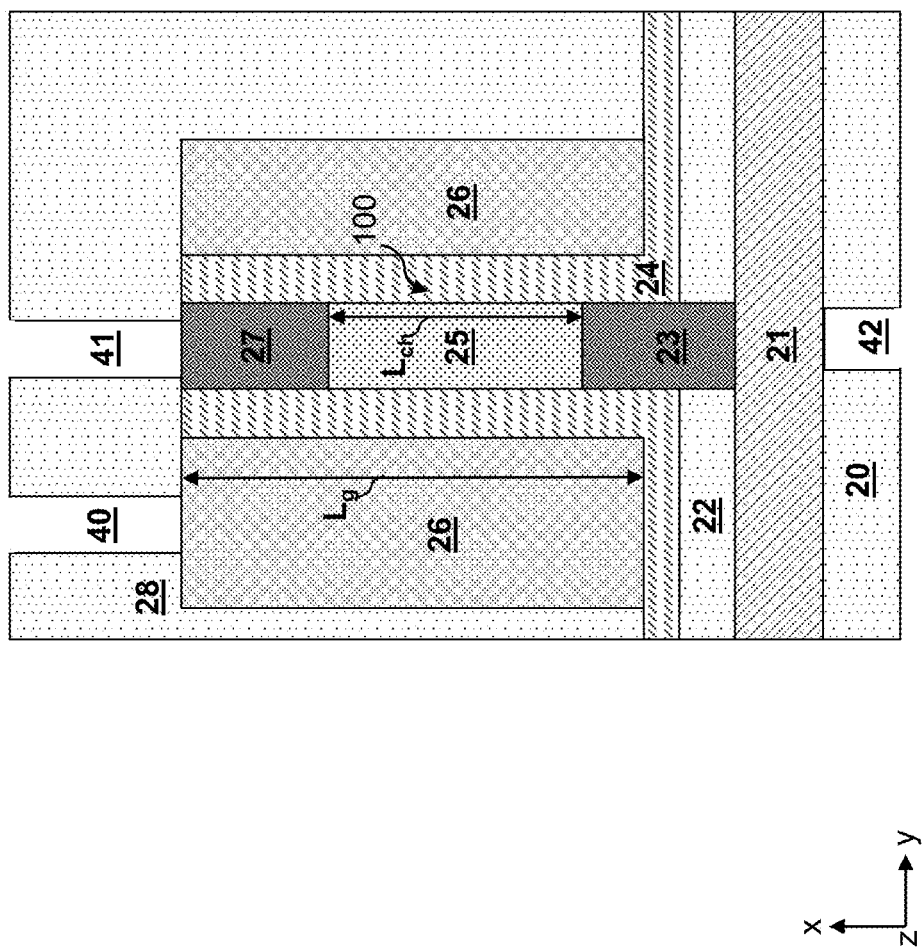
FIG. 17 is a vertical cross-sectional view of the exemplary structure after opening vias in the ILD layer in a second orientation suitable for use in various embodiments.

In an alternate configuration, rather than the contact metal layer 21 being accessed from above by etching through the ILD layer 28, dielectric layer 24, and spacer oxide layer 22 as in transistor 10, the contact metal layer 21 may be accessed from below. The formation process of such a transistor may be the same as discussed above through FIG. 13. The process may differ from the process of forming transistor 10, in that a via opening 42 may be formed from below the structure as illustrated in FIG. 17. With reference to FIGS. 1-13, FIG. 17 is a vertical cross-sectional view of the exemplary structure after opening vias 40, 41, and 42 in a second orientation in which via 42 is opened through the ILD layer 20 while vias 40 and 41 are opened through the ILD layer 28. A top surface of the gate structure 26 and a top surface of the source/drain region 27 may be physically exposed at the bottom of each via 40, 41, while a bottom surface of the contact metal layer 21 may be physically exposed at the top of via 42.

Figure 18:
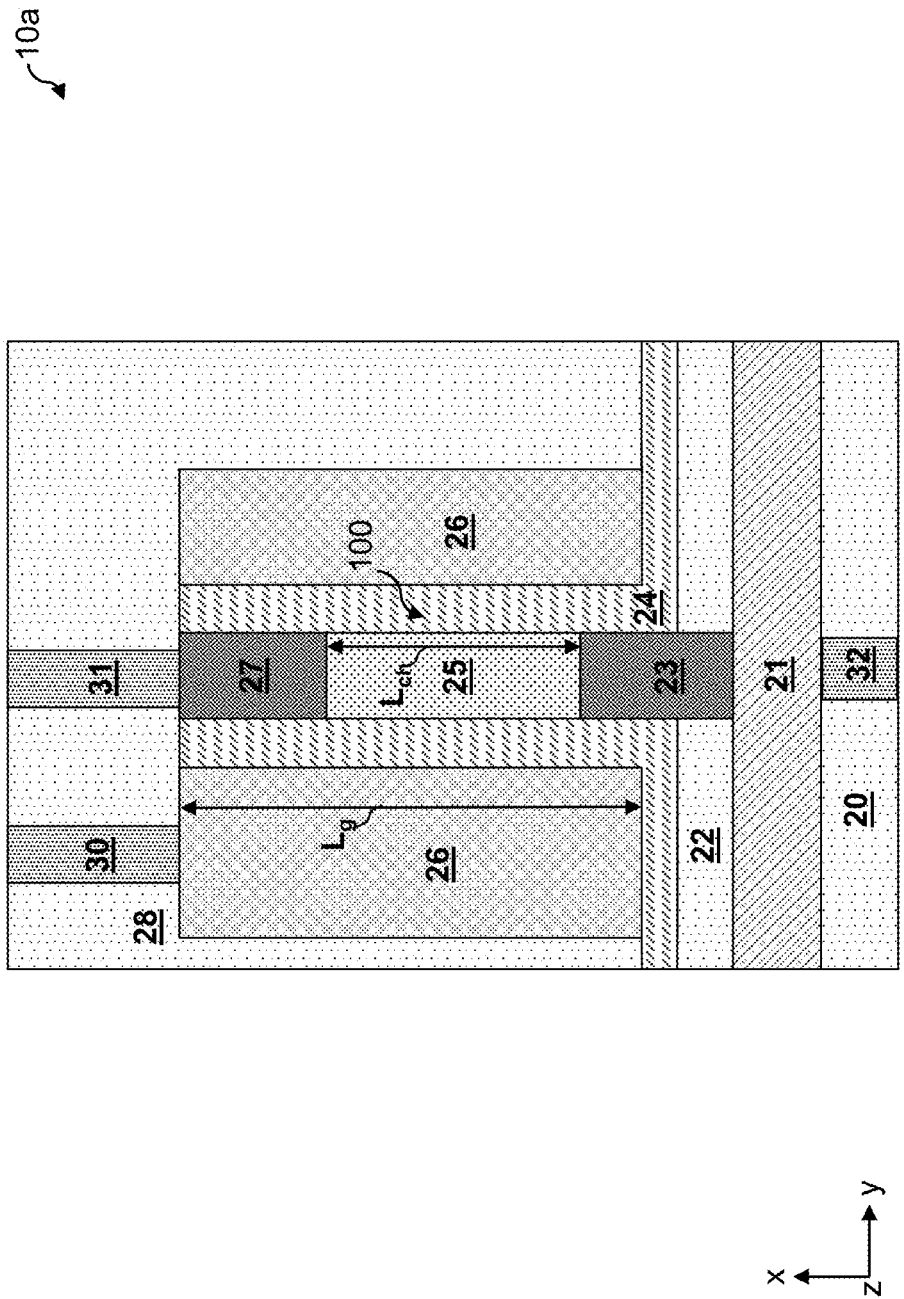
FIG. 18 is a vertical cross-sectional view of an exemplary transistor.

FIG. 18 is a vertical cross-sectional view of an exemplary transistor 10a, such as a VGAA transistor. As discussed above, at least one conductive material, such as a metal, may be deposited in the via openings 40, 41, 42 to form contact structures 30, 31, and 32, and excess portions of the at least one conductive material may be removed from above the horizontal plane including the top surface of the ILD layer 28 by a planarization process (such as a chemical mechanical planarization process) and from the horizontal plane including the bottom surface of the ILD layer 20 by a planarization process (such as a chemical mechanical planarization process). In the transistor 10a, the length $L_{ch}$ of the channel region 25 of the channel structure 100 may be less than the length $L_g$ of the gate structure 26. The transistor 10a may differ from the transistor 10, in that in the transistor 10a bottom access may be provided by contact structure 32 through ILD layer 20 such that the transistor may be stacked above a memory element.

Figure 19:
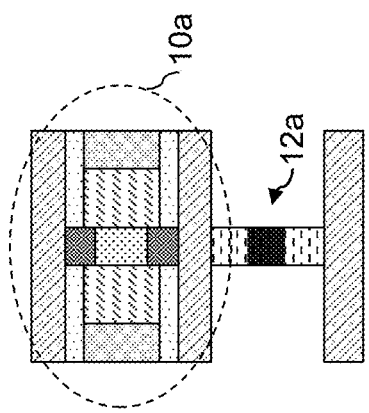
FIG. 19 is a vertical cross-sectional view of an exemplary transistor connected to a memory element in series.

FIG. 19 is a vertical cross-sectional view of the exemplary transistor 10a connected to the memory element 12a in series. The transistor 10a and memory element 12a may be stacked-up in the same direction (e.g., the x-direction). The transistor 10a may be connected above the memory element 12a. The memory element 12a may be a MTJ type memory element, GMR type memory element, etc. The memory element 12a may be a memory element suitable for use in MRAM devices, RRAM devices, PCRAM devices, etc.

Figure 20:
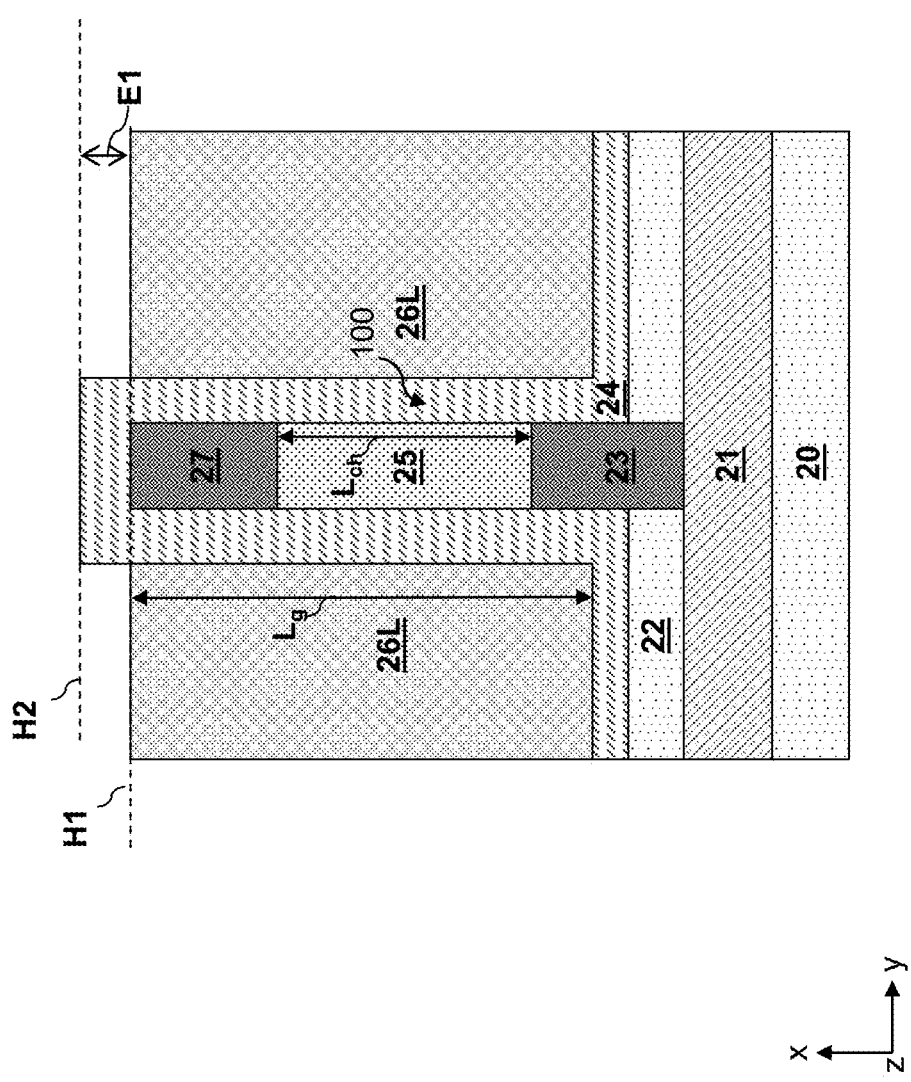
FIG. 20 is a vertical cross-sectional view of the exemplary structure after selective removal of gate material.

In alternate configurations, rather than the dielectric layer 24 and gate layer 26L being removed to the same planar level H1 to expose the source/drain region 27 as illustrated in FIG. 9, the gate layer 26L may be selectively etched to the planar level H1 while the dielectric layer 24 may be left in place over the source/drain region 27 to protect the channel structure 100 as illustrated in FIG. 20. With reference to FIGS. 1-8, in FIG. 20 the gate layer 26L may be selectively etched to the planar level H1 leaving the dielectric layer 24 at a planar level H2 such that the dielectric layer 24 extends an elevation µl beyond the plane H1 where the source/drain region 27 and gate layer 26L terminate.

Figure 21:
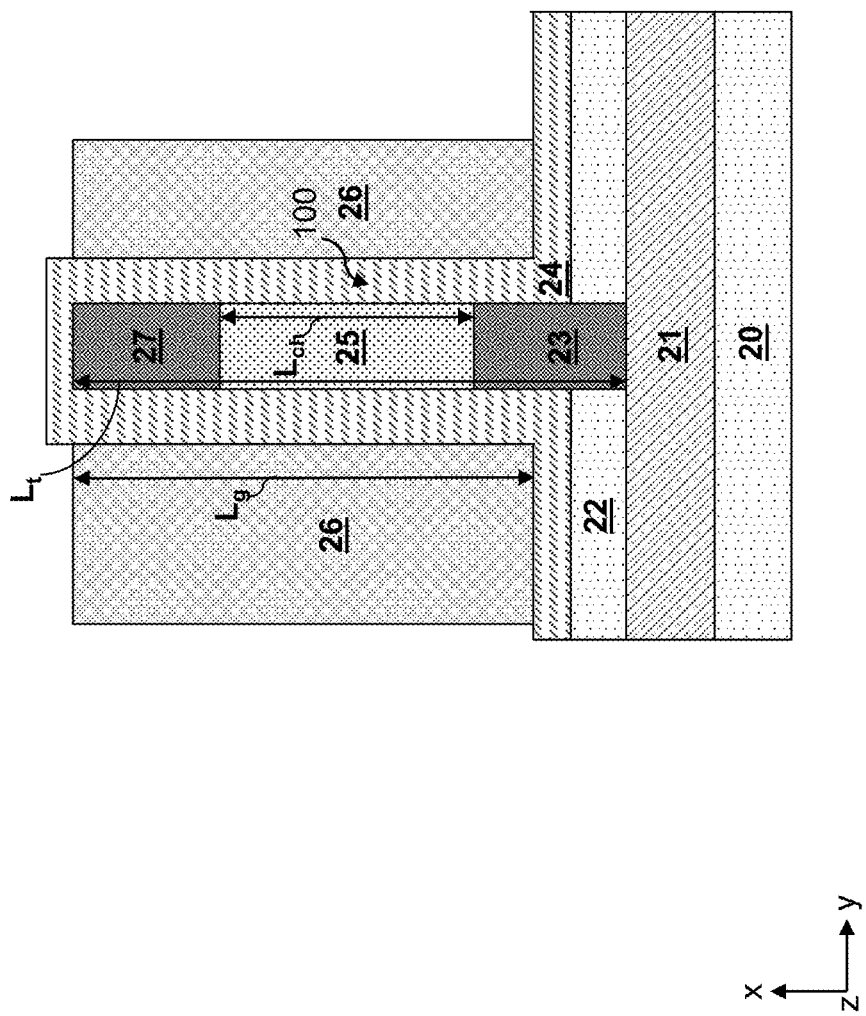
FIG. 21 is a vertical cross-sectional view of the exemplary structure after gate structure formation.

FIG. 21 is a vertical cross-sectional view of the exemplary structure after gate structure 26 formation. The operations to form the gate structure 26 as shown in FIG. 21 may be similar to the operations discussed above with reference to FIG. 10. FIG. 21 illustrates that the final gate structure 26 may be formed by removal of the gate material from the gate layer 26L outboard of the dielectric layer 24 and channel structure 100 to expose at least a portion of the dielectric layer 24 above the spacer oxide layer 22. As an example, the gate material may be removed from the gate layer 26L by etching to form the gate structure 26. The length $L_g$ of the gate structure 26 may be less than the overall length $L_t$ of the channel structure 100 while the length $L_g$ of the gate structure 26 may be greater than the length $L_{ch}$ of the channel region 25. The gate structure 26 orientation may be in any direction about the stacked-up direction (e.g., in any orientation about the x-axis). The gate structure 26 orientation may be controlled by the mask placement for the gate structure 26 over the gate layer 26L, dielectric layer 24, and channel structure 100 before etching. The gate structure 26 orientation may be selected based on the desired orientation contacts to the gate structure 26 that may be selected for a desired finished transistor configuration. For example, FIG.

22A is a top-down view of the exemplary structure of FIG. 21 showing a first orientation of the gate structure 26 generally aligned in the y-direction. The vertical plane A-A' is the plane of the vertical cross-section of FIG. 21. As another example, FIG. 22B is a top-down view of the exemplary structure of FIG. 21 showing a second orientation of the gate structure 26 generally aligned in the z-direction. The vertical plane A-A' is the plane of the vertical cross-section of FIG. 21.

Figure 23:
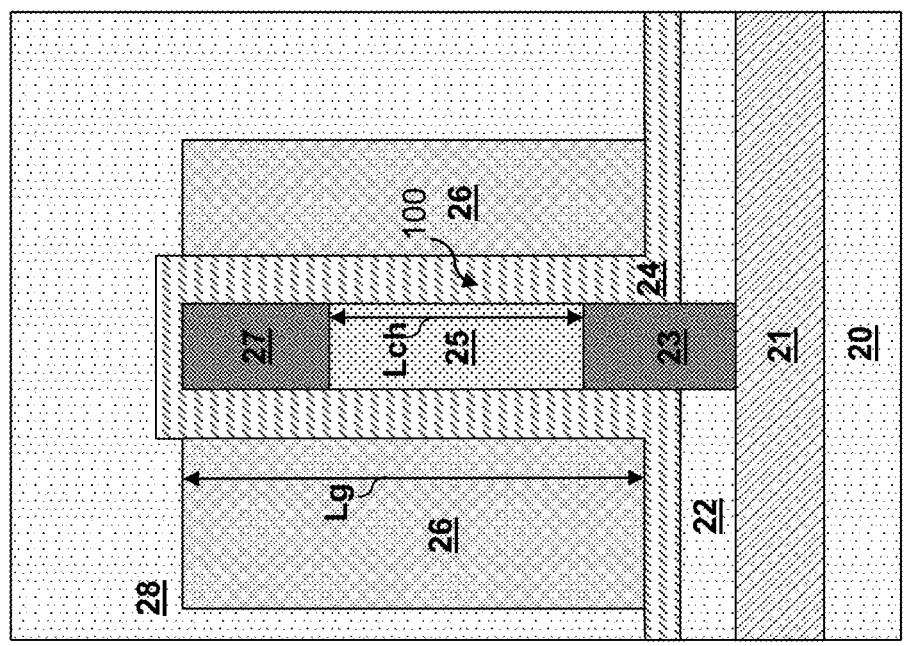
FIG. 23 is a vertical cross-sectional view of the exemplary structure after ILD layer formation.

FIG. 23 is a vertical cross-sectional view of the exemplary structure after ILD layer 28 formation. The operations to form the ILD layer 28 as shown in FIG. 23 may be similar to the operations discussed above with reference to FIG. 13.

Figure 24:
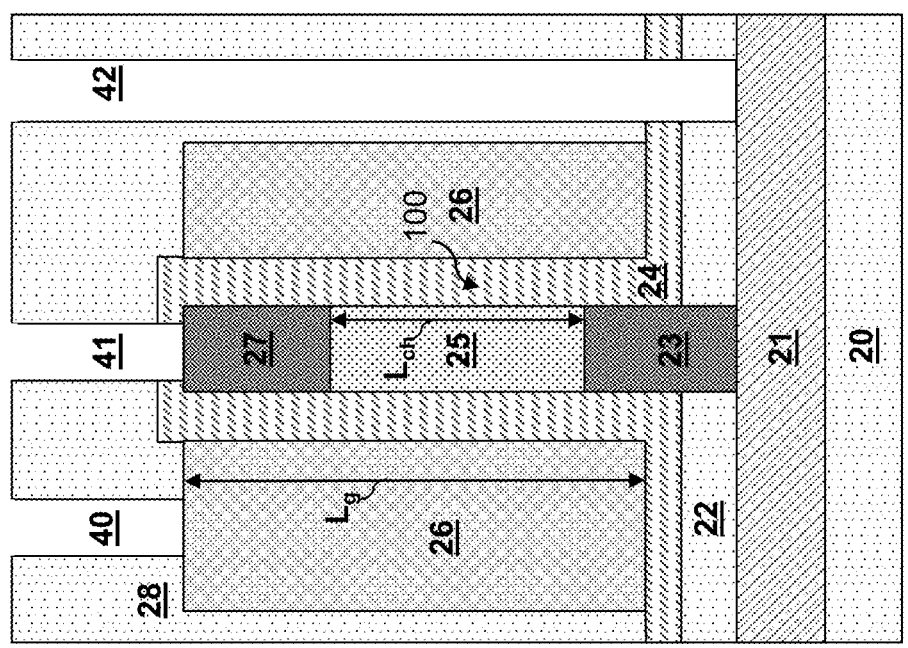
FIG. 24 is a vertical cross-sectional view of the exemplary structure after opening vias in the ILD layer in the first orientation suitable for use in various embodiments.

FIG. 24 is a vertical cross-sectional view of the exemplary structure after opening vias 40, 41, 42 in the ILD layer 28 in the first orientation suitable for use in various embodiments. The operations to form the vias 40, 41, 42 as shown in FIG. 24 may be similar to the operations discussed above with reference to FIG. 14. One difference in the structure of FIG. 24 and FIG. 14 is that the via 41 may extend through the dielectric layer 24 to expose the top surface of source/drain region 27.

Figure 25:
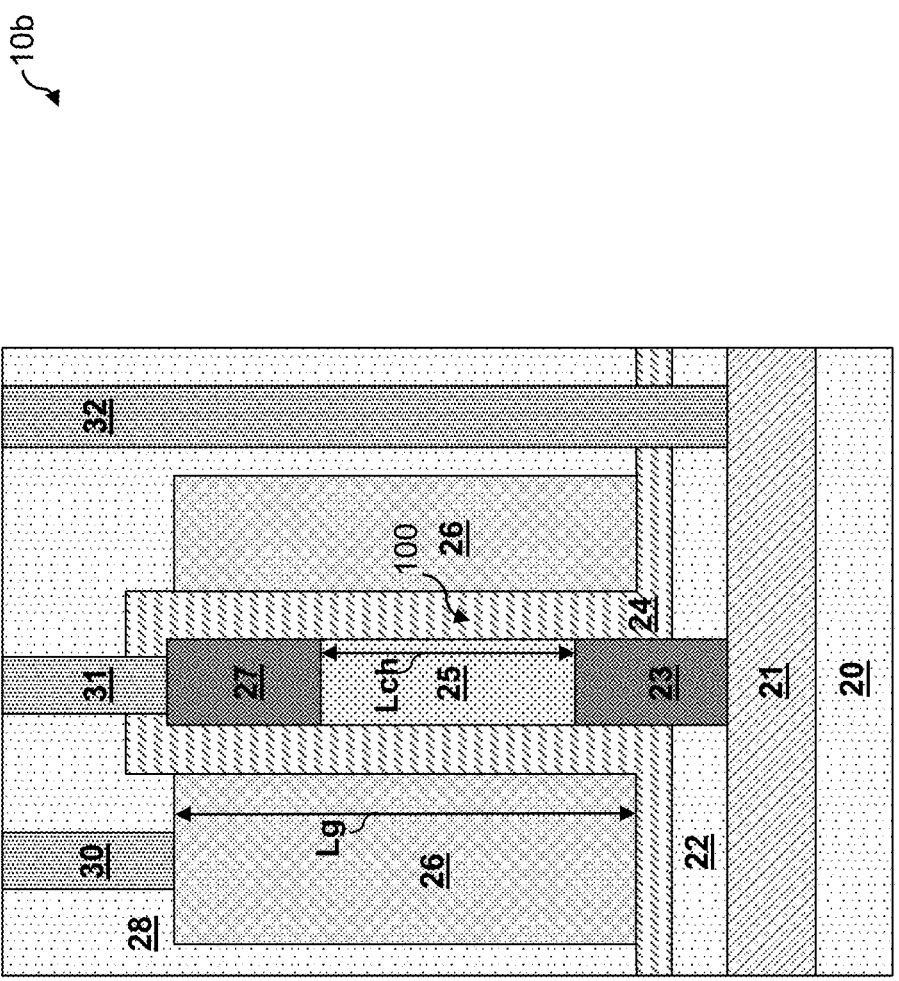
FIG. 25 is a vertical cross-sectional view of an exemplary transistor.

FIG. 25 is a vertical cross-sectional view of an exemplary transistor 10b, such as a VGAA transistor. The formation process of such a transistor 10b may be the same as discussed above in FIG. 15 to form the contact structures 30, 31, and 32. Similar to the transistor 10, the transistor 10b may be configured to be connected to a memory element, such as memory element 12, in series vertically such that the memory element is above the transistor 10b.

Figure 26:
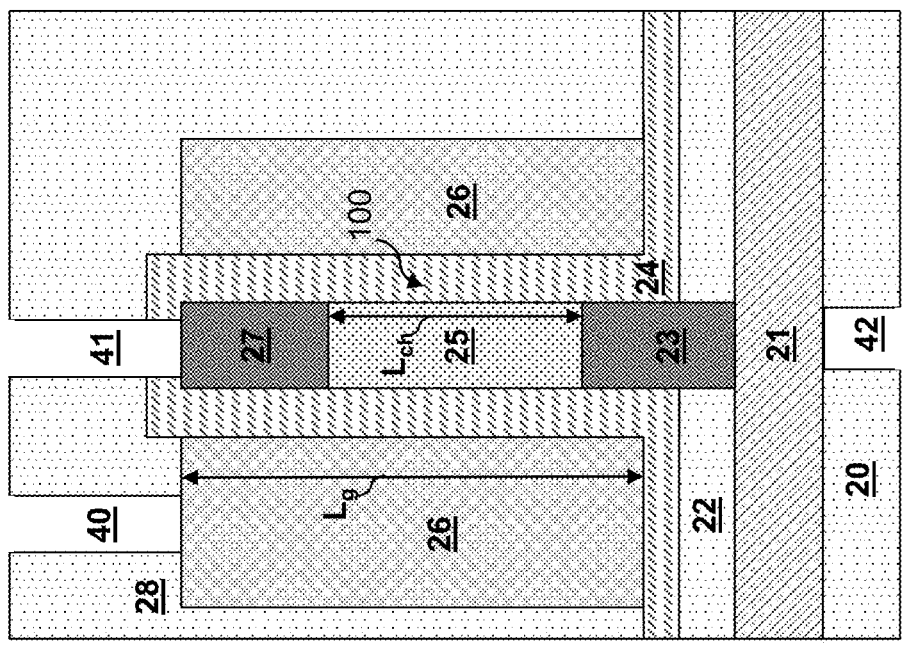
FIG. 26 is a vertical cross-sectional view of the exemplary structure after opening vias in the ILD layer in the second orientation suitable for use in various embodiments.

In an alternate configuration, rather than the contact metal layer 21 being accessed from above by etching through the ILD layer 28, dielectric layer 24, and spacer oxide layer 22 as in transistor 10b, the contact metal layer 21 may be accessed from below. The formation process of such a transistor may be the same as discussed above through FIG. 23. The process may differ from the process of forming transistor 10b, in that a via opening 42 may be formed from below the structure as illustrated in FIG. 26. With reference to FIGS. 1-23, FIG. 26 is a vertical cross-sectional view of the exemplary structure after opening vias 40, 41, and 42 in a second orientation in which via 42 is opened through the ILD layer 20 while vias 40 and 41 are opened through the ILD layer 28 and ILD layer 28 and dielectric layer 24, respectively. A top surface of the gate structure 26 and a top surface of the source/drain region 27 may be physically exposed at the bottom of each via 40, 41, while a bottom surface of the contact metal layer 21 may be physically exposed at the top of via 42.

Figure 27:
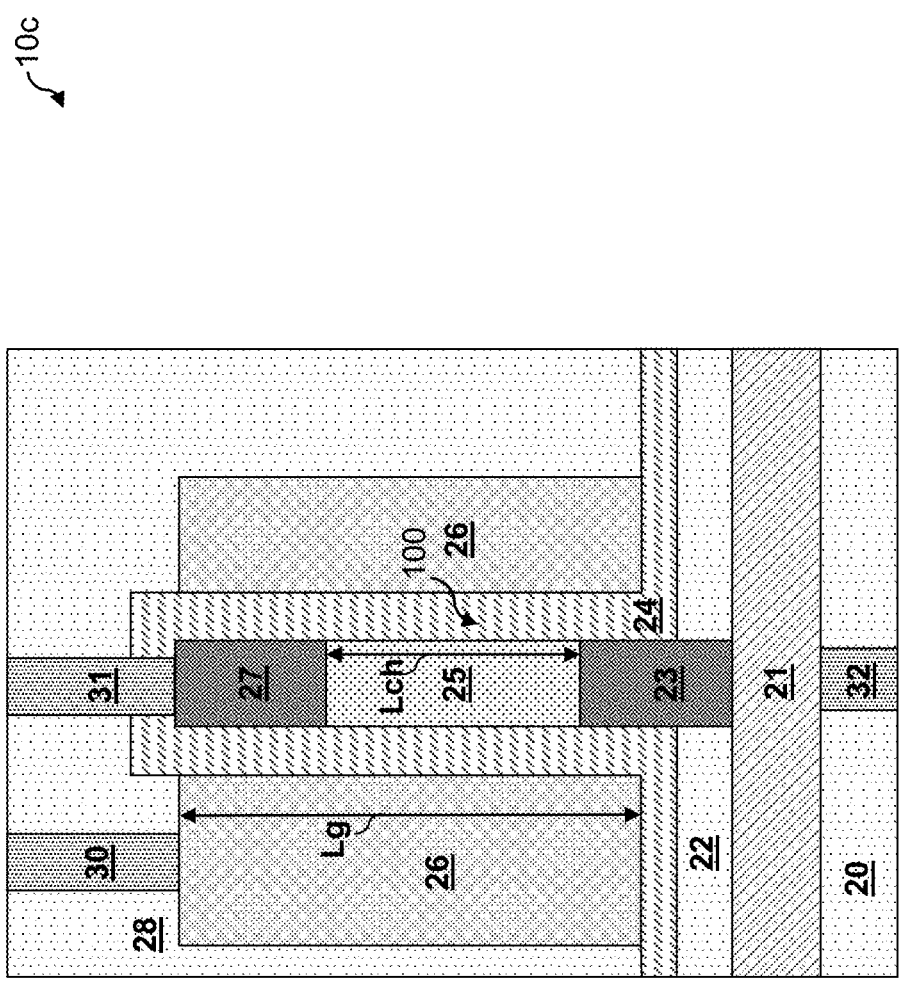
FIG. 27 is a vertical cross-sectional view of an exemplary transistor.

FIG. 27 is a vertical cross-sectional view of an exemplary transistor 10c, such as a VGAA transistor. As discussed above, at least one conductive material, such as a metal, may be deposited in the via openings 40, 41, 42 to form contact structures 30, 31, and 32, and excess portions of the at least one conductive material may be removed from above the horizontal plane including the top surface of the ILD layer 28 by a planarization process (such as a chemical mechanical planarization process) and from the horizontal plane including the bottom surface of the ILD layer 20 by a planarization process (such as a chemical mechanical planarization process). In the transistor 10c, the length $L_{ch}$ of the channel region 25 of the channel structure 100 may be less than the length $L_g$ of the gate structure 26. The transistor 10c may differ from the transistor 10b, in that in the transistor 10c bottom access may be provided by contact structure 32 through ILD layer 20 such that the transistor may be stacked above a memory element. Similar to the transistor 10a, the transistor 10c may be configured to be connected to a memory element, such as memory element 12a, in series vertically such that the memory element is below the transistor 10c.

Figure 29:
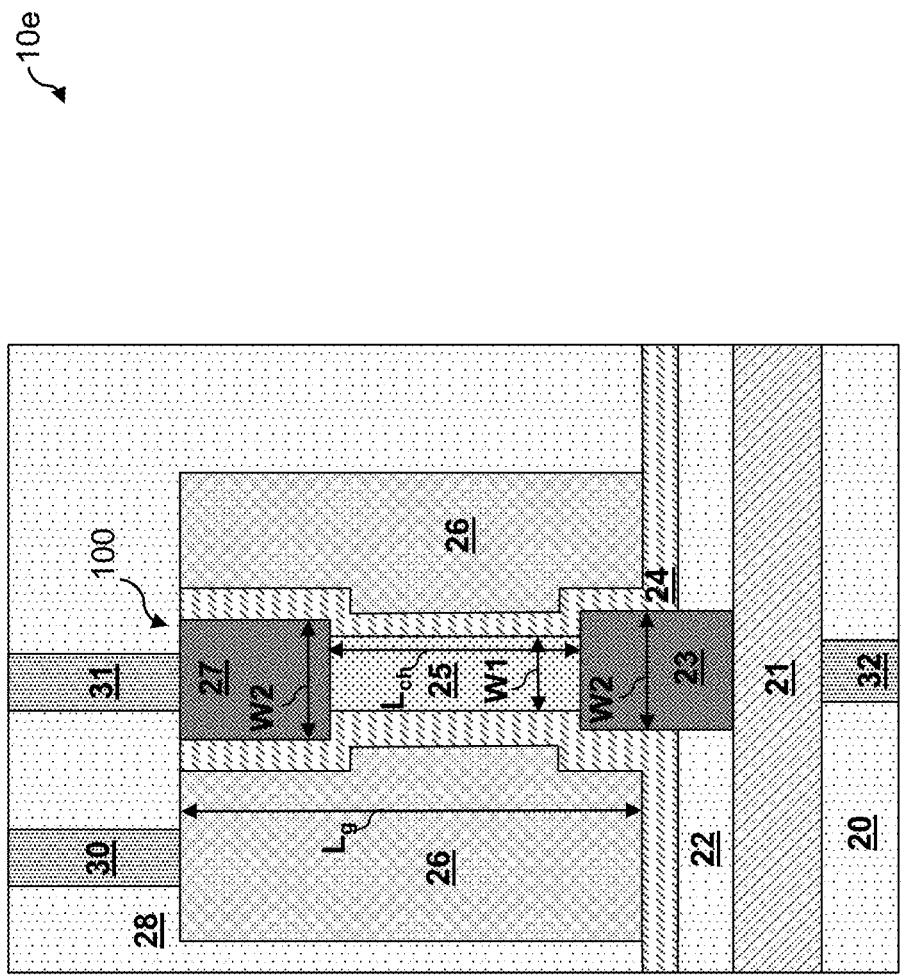
FIG. 29 is a vertical cross-sectional view of an exemplary transistor.

In an alternative configuration, the channel structure 100 may not have a uniform diameter in the stacked-up direction (e.g., the x-direction. As illustrated in FIGS. 28 and 29, the transistor 10d, 10e may be configured such that the channel structure 100 has a complex structure. The transistors 10d, 10e may be VGAA transistors. As one example, the channel region 25 of the channel structure 100 may be configured to be of a narrower diameter W1 than the diameter W2 of the two source/drain regions 23, 27. FIG. 28 illustrates such a transistor 10d with a non-uniform diameter channel structure 100 in the first configuration in which the contact structures 30, 31, and 32 are formed from above the transistor 10d. FIG. 29 illustrates such a transistor 10e with a non-uniform diameter channel structure 100 in the first configuration in which the contact structures 30, 31 are formed from above the transistor 10e and the contact structure 32 is formed from below the transistor 10e. In some embodiments, the channel structure 100 may be formed entirely of the same material, such as entirely of ITO, when the channel structure 100 is not uniform as illustrated in FIGS. 28 and 29. In some embodiments, the channel structure 100 may be formed from different materials, such as the two source/drain regions 23, 27 formed from ITO and the channel region 25 formed from IGZO, when the channel structure 100 is not uniform as illustrated in FIGS. 28 and 29.

Figure 30:
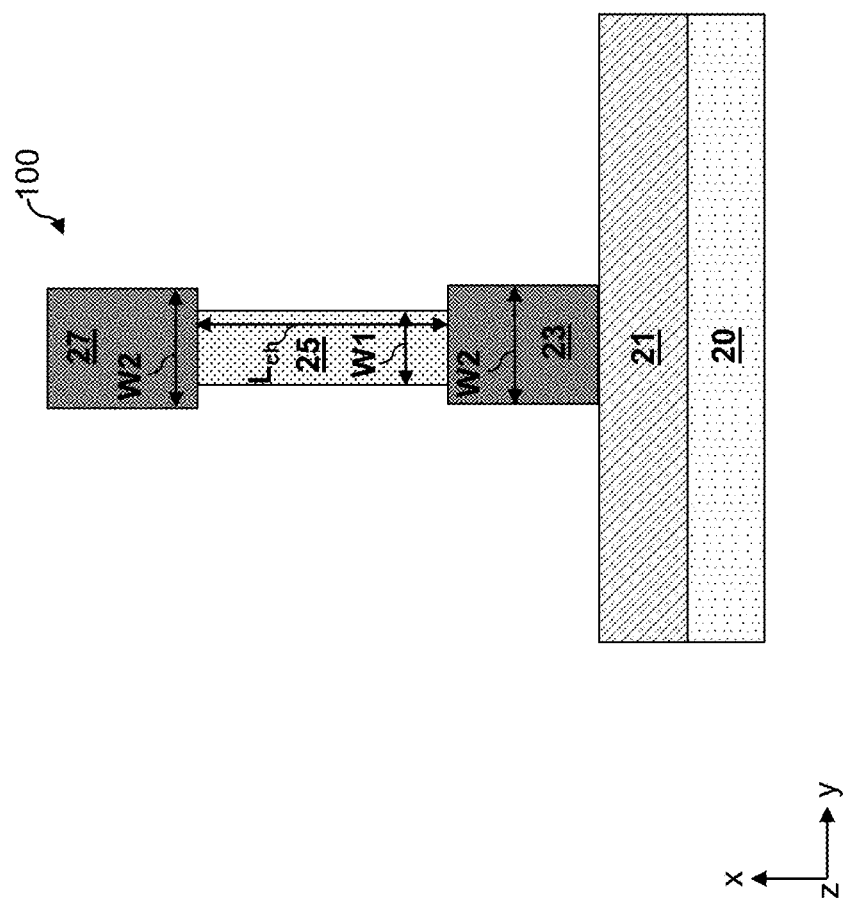
FIG. 30 is a vertical cross-sectional view of an exemplary structure after formation of a non-uniform diameter channel structure.

A non-uniform diameter channel structure 100 may be formed in various manners using various material deposition and removal processes, such as using selective etching, dry etching, wet etching, masked deposition, etc. As one example, when the non-uniform diameter channel structure 100 may be formed from ITO and IGZO such that the two source/drain regions 23, 27 may be formed from ITO and the channel region 25 may be formed from IGZO, the channel structure 100 may be selectively isotropically (e.g., wet) etched to remove a portion of the IGZO in the channel region 25 without removing the ITO in the source/drain regions 23,27. With reference to FIGS. 1-4, an initially formed uniform diameter channel structure 100, such as that illustrated in FIG. 4, may be selectively isotropically etched to remove a portion of the IGZO in the channel region 25 without removing the ITO in the source/drain regions 23, 27, thereby resulting in the non-uniform diameter channel structure 100 as illustrated in FIG. 30. In such an example, after forming the non-uniform diameter channel structure 100 illustrated in FIG. 30, the formation of dielectric layer 24, gate structure 26, ILD layer 28, vias 40, 41, 42, and contact structures 30, 31, and 32 may proceed as discussed above with reference to FIGS. 5A-18, 28, and 29 to result in the transistors 10d, 10e including channel structures 100 that have a complex structure.

Figure 31:
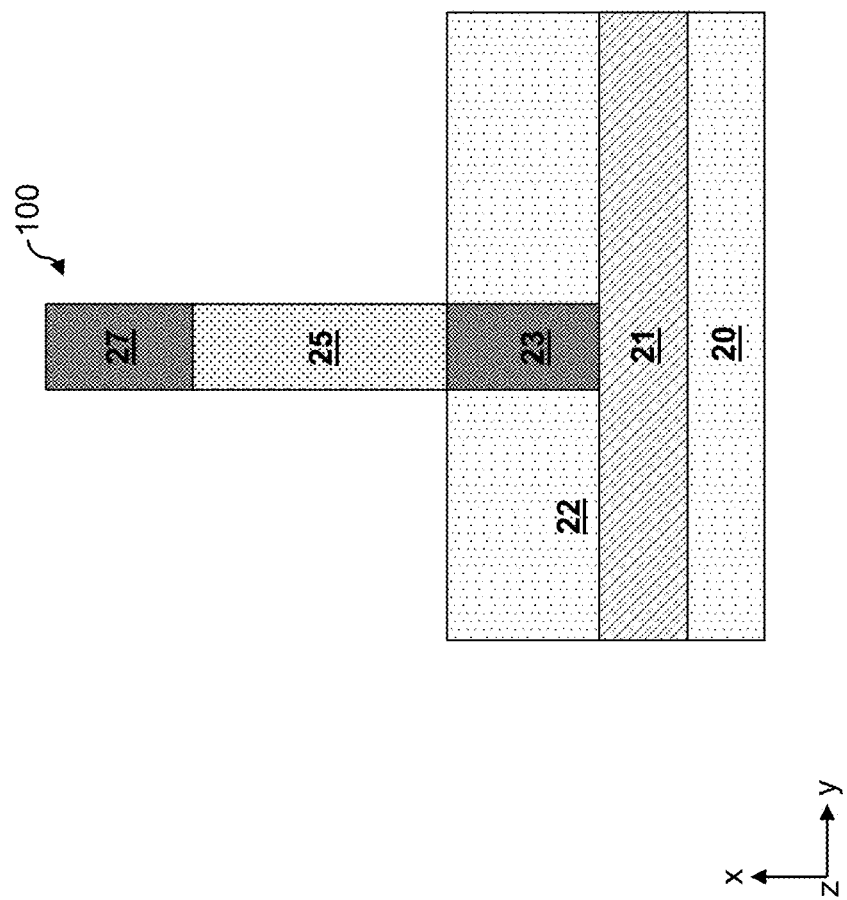
FIG. 31 is a vertical cross-sectional view of the exemplary structure after formation of a spacer oxide layer.
Figure 32:
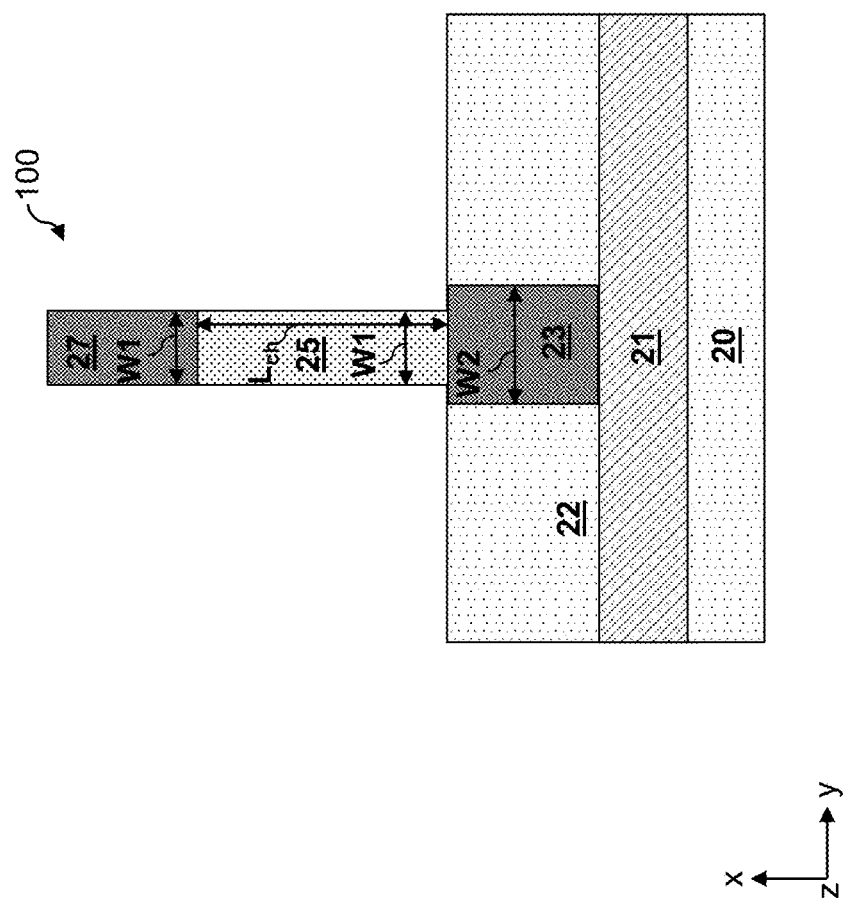
FIG. 32 is a vertical cross-sectional view of the exemplary structure after formation of a narrow diameter channel region for a channel structure.
Figure 33:
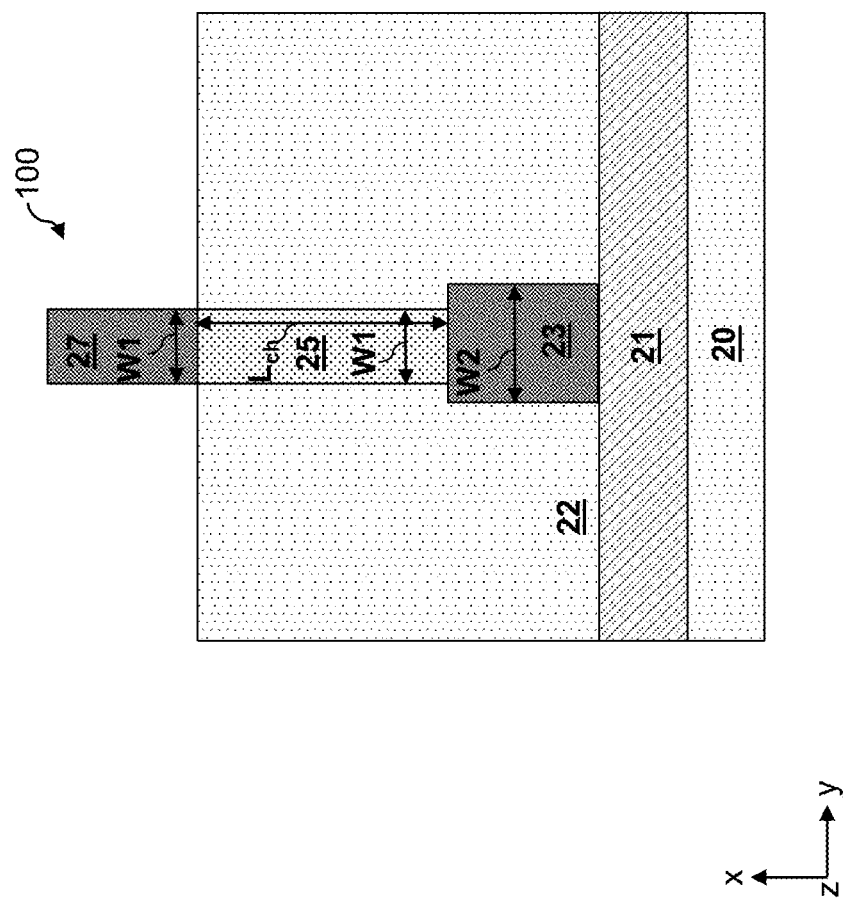
FIG. 33 is a vertical cross-sectional view of the exemplary structure after increasing a thickness of a spacer oxide layer.
Figure 34:
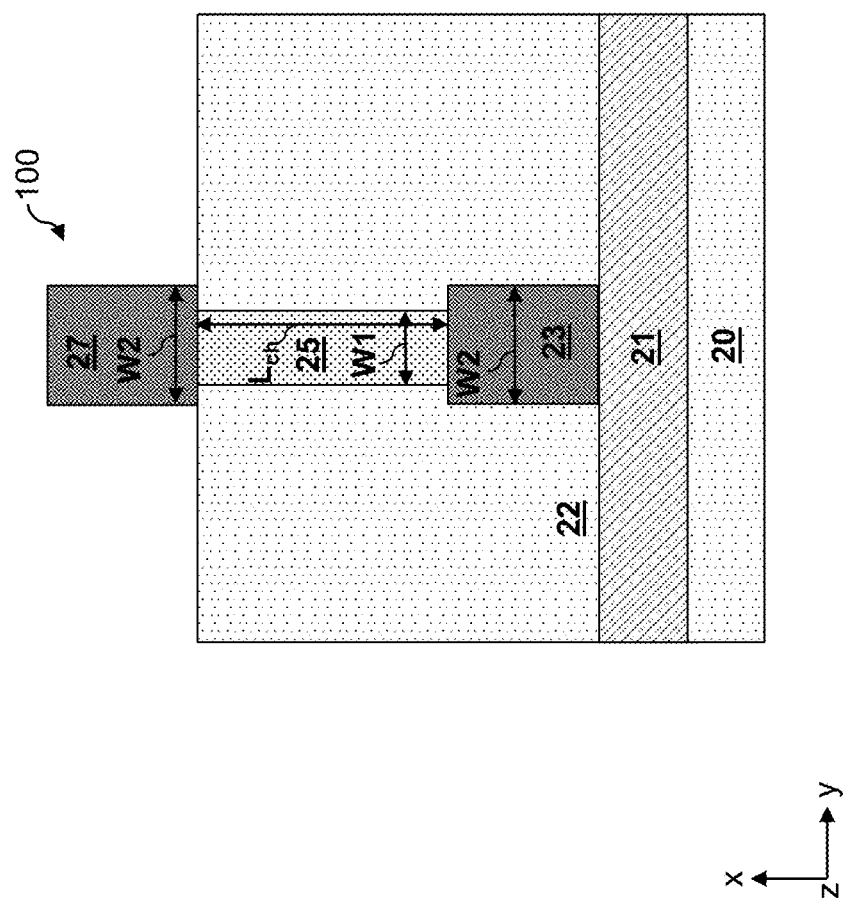
FIG. 34 is a vertical cross-sectional view of the exemplary structure after increasing a diameter of a source/drain region of a channel structure.
Figure 35:
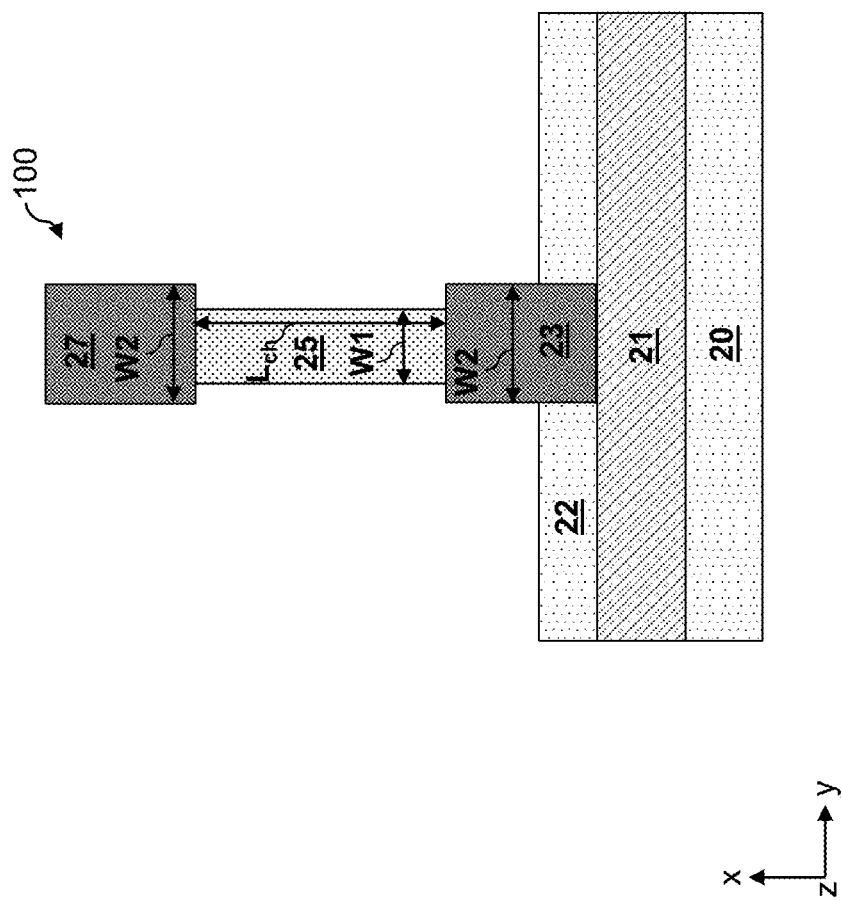
FIG. 35 is a vertical cross-sectional view of an exemplary structure after formation of a non-uniform diameter channel structure.

As another example, when the non-uniform diameter channel structure 100 may be formed entirely of ITO such that the two source/drain regions 23, 27 are formed from ITO and the channel region 25 is formed from ITO, the non-uniform diameter channel structure 100 may be formed in multi-step process. With reference to FIGS. 1-6, after an initially formed uniform diameter channel region 100, such as that illustrated in FIG. 4, is formed, the spacer oxide layer 22 as discussed with reference to FIG. 6, may be formed on top of the contact metal layer 21 in a direction, such as the x-direction illustrated in FIG. 31, to the same height or thickness (e.g., T1) as the source/drain region 23. The channel region 25 and source/drain region 27 may then be etched, such as by isotropic etching to the selected diameter W1 for the channel region 25 in the final non-uniform diameter channel structure 100 as illustrated in FIG. 32. After etching the channel region 25 and source/drain region 27, additional spacer oxide material may be deposited on the spacer oxide layer 22 as discussed with reference to FIG. 6, to raise the spacer oxide layer 22 in a direction, such as the x-direction illustrated in FIG. 33, to the same height as the top of the channel region 25 thereby leaving only the source/drain region 27 exposed as shown in FIG. 33. While FIG. 33 illustrates the same spacer oxide layer 22 material may be deposited on the existing spacer oxide layer 22, in some embodiments, a different dielectric material may be deposited over the spacer oxide layer 22. Additional source/drain region material may be added to the source/drain region 27 to grow the source/drain region 27 to the selected diameter W2 of the two source/drain regions 23, 27 in the final non-uniform diameter channel structure 100 as illustrated in FIG. 34. Once the source/drain region 27 is grown to the selected diameter W2 of the two source/drain regions 23, 27 in the final non-uniform diameter channel structure 100, spacer oxide layer material may be removed to result in a spacer oxide layer 22 of a final selected thickness as illustrated in FIG. 35. In such an example, after forming the non-uniform diameter channel structure 100 and forming the spacer oxide layer 22 to its final selected thickness as illustrated in FIG. 35, the formation of dielectric layer 24, gate structure 26, ILD layer 28, vias 40, 41, 42, and contact structures 30, 31, and 32 may proceed as discussed above with reference to FIGS. 7-18, 28, and 29 to result in the transistors 10d, 10e including channel structures 100 that have a complex structure.

Other formation processes than those discussed with reference to FIGS. 30-35 are within the contemplated scope of the disclosure for forming a non-uniform diameter channel structure 100, including three-dimensional etching, as well as any other suitable formation process.

Figure 36:
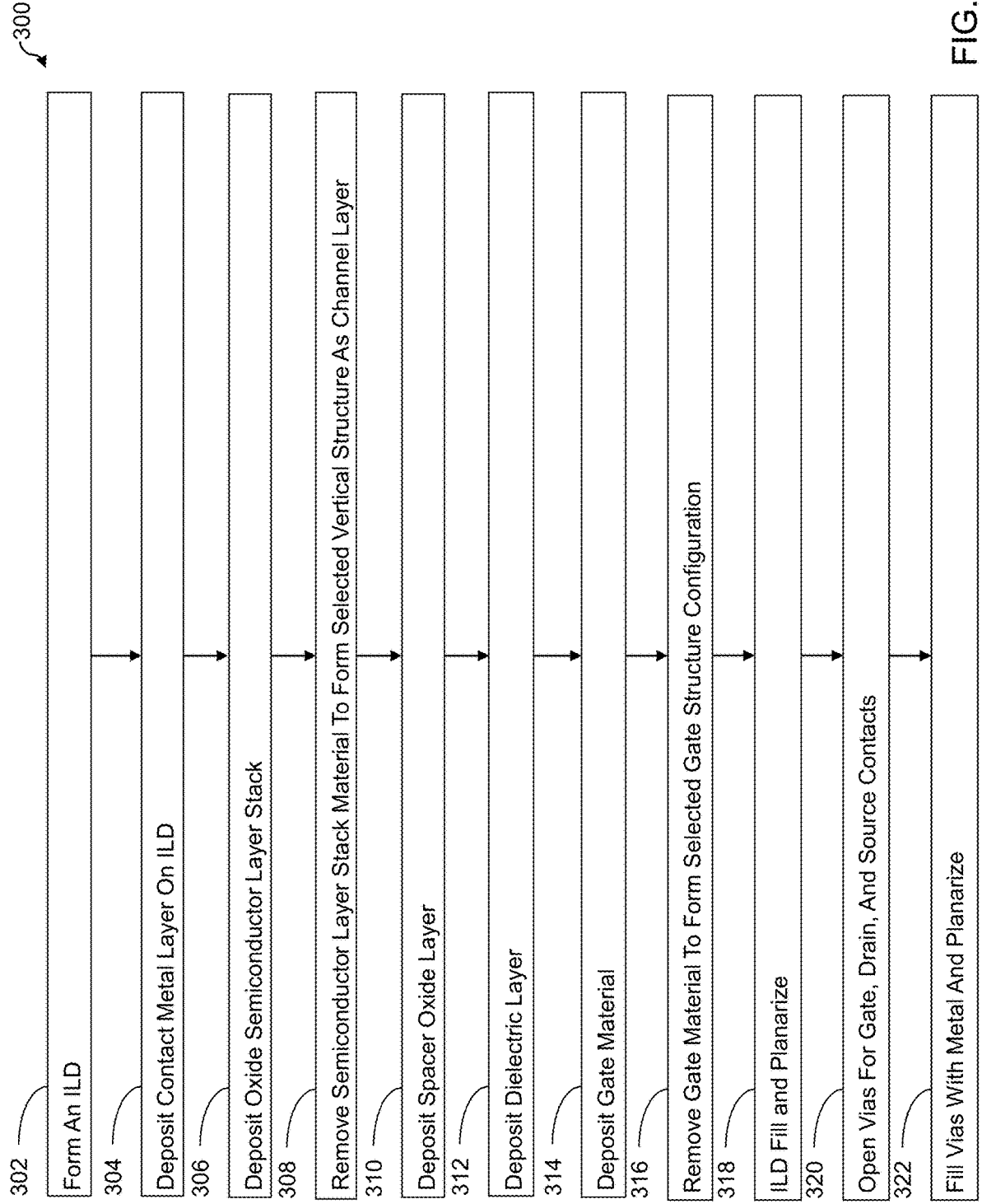
FIG. 36 is a process flow illustrating steps of a method for manufacture of transistors in accordance with various embodiments of the present disclosure.

FIG. 36 is a process flow illustrating steps of a method 300 for manufacture of transistors, such as transistors 10, 10a, 10b, 10c, 10d, 10e, etc., in accordance with various embodiments of the present disclosure. Referring to step 302 and FIG. 1, an ILD layer 20 may be formed. Referring to step 304 and FIG. 2, a contact metal layer 21 may be deposited on the ILD layer 20. Referring to step 306 and FIG. 3, an oxide semiconductor layer stack (e.g., formed of semiconductor oxide layers 23L, 25L, 27L) may be deposited on the contact metal layer 21. Referring to step 308 and FIGS. 4-5D, semiconductor layer stack material may be removed to form a selected vertical structure as a channel structure 100. The channel structure 100 may include a channel region 25 separating two source/drain regions 23 and 25. In some embodiments, forming the channel structure 100 may include forming a non-uniform diameter channel structure 100, such as by selective etching of the material forming the channel region 25 as discussed with reference to FIG. 30. Referring to step 310 and FIG. 6, a spacer oxide layer 22 may be deposited. In some embodiments, the spacer oxide layer 22 may be deposited as part of forming a non-uniform diameter channel structure 100 as discussed with reference to FIGS. 31-35. Referring to step 312 and FIG. 7, a dielectric layer 24 may be deposited. Referring to step 314 and FIG. 8, a gate material 26L may be deposited. Referring to step 316 and FIGS. 9-12 and 20-22B, gate material 26L may be removed to form selected gate structure 26 configuration. Referring to step 318 and FIGS. 13 and 23, ILD layer 28 fill and planarization may be performed. Referring to step 320 and FIGS. 14, 17, 24, and 26 vias 40, 41, and 42 for gate, drain, and source contacts may be opened. Referring to step 322 and FIGS. 15, 18, 25, and 27, the vias 40, 41, 42 may be filled with metal and planarized to form contact structures 30, 31, 32 and complete the transistor (e.g., transistor 10, 10a, 10b, 10c, 10d, 10e).

The various embodiments of the present disclosure may be used to manufacture and operate semiconductor transistors, such as thin-film transistors (TFTs), that are VGAA transistors in which current flow out-of-plane. The various embodiments of the present disclosure may be used to manufacture and operate semiconductor devices, such as semiconductor devices including vertical transistors connected in series with memory elements, such as MTJ type memory elements, GMR type memory elements, etc. The various embodiments may be used to manufacture and operate semiconductor devices including a memory element and vertical TFT, such as MRAM devices, RRAM devices, PCRAM devices, etc. The various embodiment semiconductor transistors may improve memory density and may be simpler to manufacture.

Various embodiments may include a semiconductor transistor, such as a TFT that is a VGAA transistor, the semiconductor transistor including a channel structure 100 extending up from a contact metal layer 21 in a first direction, channel structure 100 including: a channel region 25; and two source/drain regions 23, 27 located on respective sides of the channel region 25, wherein the channel region 25 and the two source/drain regions 23 are stacked up along the first direction; and a gate structure 26 surrounding the channel region 25. In various embodiments, a length of the gate structure 26 in the first direction may be greater than a length of the channel region 25. In various embodiments, a length of the channel structure 100 in the first direction may be greater than the length of the channel region 25. In various embodiments, a thickness of each of the two source/drain regions 23, 27 in the first direction may be the same. In various embodiments, a thickness of each of the two source/drain regions 23, 27 in the first direction may be different. In various embodiments, the channel region 25 may include Indium Gallium Zinc Oxide (IGZO). In various embodiments, each of the two source/drain regions 23, 27 may include Indium Tin Oxide (ITO). In various embodiments, each of the two source/drain regions 23, 27 may include IGZO having a different composition than the IGZO of the channel region 25. In various embodiments, the channel structure 100 may be a cylindrical structure extending in the first direction. In various embodiments, the transistor may further include a dielectric layer 24 surrounding the channel structure 100 between the channel structure 100 and the gate structure 25. In various embodiments, the dielectric layer 24, the channel structure 100, and the gate structure 26 may terminate at a same plane extending orthogonally to the first direction. In various embodiments, the dielectric layer 24 may extend a distance in the first direction beyond a plane extending orthogonally to the first direction at which the channel structure 100 and gate structure 26 terminate. In various embodiments, a diameter of the channel structure may be uniform along the first direction. In various embodiments, a diameter of the channel region 100 along the first direction may be less than a diameter of each of the two source/drain regions 23, 27 along the second direction. In various embodiments, the channel region 25 and each of the two source/drain regions 23 may include Indium Tin Oxide (ITO).

Various embodiments may include semiconductor device, such as a MRAM device, RRAM device, PCRAM device, etc., including a memory element 12a, such as a MTJ type element, GMR type element, etc., and a transistor 10 connected to the memory element 12a in series, the memory element 12a and transistor 10 stacked up along a first direction, wherein the transistor 10 includes a channel structure 100 including a channel region 25, and two source/drain regions 23, 27 located on respective sides of the channel region 25, wherein the channel region 25 and the two source/drain regions 23, 27 are stacked up along the first direction, a gate structure 26 surrounding the channel region 25, wherein a length of the gate structure 26 in the first direction is greater than a length of the channel region 25, a first contact structure 32 disposed on a bottom surface of the channel structure and connected to one of the source/drain regions, and a second contact structure 31 disposed on a top surface of the channel structure and connected to one of the source/drain regions. In various embodiments, the channel region 25 may include Indium Gallium Zinc Oxide (IGZO) and each of the two source/drain regions comprise Indium Tin Oxide (ITO). In various embodiments, the transistor 10 may further include a dielectric layer 24 surrounding the channel structure 100 between the channel structure 100 and the gate structure 26, and a spacer oxide 22 material separating the first contact structure 31 from the dielectric layer 24 and the gate structure 26. In various embodiments, the gate structure 26 may be located in between the first contact structure 32 and the second contact structure 31. In various embodiments, a diameter of the channel structure 100 may be uniform along the first direction. In various embodiments, a diameter of the channel region 25 along the first direction may be less than a diameter of each of the two source/drain regions 23, 27 along the first direction. In various embodiments, a thickness of each of the two source/drain regions 23, 27 in the first direction may be different.

Various embodiments may include a method of forming a semiconductor transistor, such as a TFT that is a VGAA transistor, including forming a contact metal layer 21 over a first interlayer dielectric (ILD) layer 20, depositing and patterning oxide semiconductor layers 23, 25, 27 to form a selected vertical structure as a channel structure 100 over the contact metal layer 21, wherein the channel structure 100 extends up from the contact metal layer 21 in a first direction and the channel structure 100 includes a channel region 25 and two source/drain regions 23, 27 located on respective sides of the channel region 25, wherein the channel region 25 and the two source/drain regions 23, 27 are stacked up along the first direction, depositing and patterning a spacer oxide layer 22, dielectric layer 24, and gate structure 26 sequentially over the channel structure 100, wherein the gate structure 26 is configured to surround the channel region 25, depositing a second ILD layer 28 and opening vias 40, 41, 42 in the second ILD layer 28 to the gate structure 26, channel structure 100, and contact metal layer 21, and filling the vias 40, 41, 42 with metal to form contact structures 30, 31, 32. In various embodiments, the method may include removing gate material 26 to form the selected gate structure 26 such that a length of the gate structure 26 in the first direction is greater than a length of the channel region 25. In various embodiments, the method may include depositing and removing oxide semiconductor layers 23, 25, 27 to form the selected vertical structure as the channel structure 100 over the contact metal layer 21 such that a length of the channel structure 100 in the first direction is greater than the length of the channel region 25. In various embodiments, the channel region 25 may include IGZO. In various embodiments, the method may include depositing and removing oxide semiconductor layers 23, 25, 27 to form the selected vertical structure as the channel structure 100 over the contact metal layer 21 such that a diameter of the channel region 25 along the first direction is less than a diameter of each of the two source/drain regions 23, 27 along the first direction. In various embodiments, the method may include removing gate material 26 to form the selected gate structure 26 such that the dielectric layer 24, the channel structure 100, and the gate structure 26 terminate at a same plane extending orthogonally to the first direction.

The vertical gate all around transistors of the various embodiments improve memory cell density in a device. The various embodiments benefit from a simple fabrication design. The entire stack may be grown in blanket layers. Nanowires may be etched. The simple fabrication design does not require complex vertical contact engineering. The various embodiments utilize the nature of different oxide semiconductors (IGZO and ITO) to form the gate, channel and active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor transistor, comprising:
    forming a contact metal layer over a first interlayer dielectric (ILD) layer;
    depositing and removing oxide semiconductor layers to form a selected vertical structure as a channel structure over the contact metal layer, wherein the channel structure extends up from the contact metal layer in a first direction and the channel structure comprises:
        a channel region; and
        two source/drain regions located on respective sides of the channel region, wherein the channel region and the two source/drain regions are stacked up along the first direction;
    depositing a spacer oxide layer, dielectric layer, and gate material sequentially over the channel structure;
    removing gate material to form a selected gate structure, wherein the gate structure is configured to surround the channel region;
    depositing a second ILD layer and opening vias in the second ILD layer to the gate structure, channel structure, and contact metal layer; and
    filling the vias with metal to form contact structures.

2. The method of claim 1, wherein removing gate material to form the selected gate structure comprises removing gate material to form the selected gate structure such that a length of the gate structure in the first direction is greater than a length of the channel region.

3. The method of claim 1, wherein depositing and removing oxide semiconductor layers to form the selected vertical structure as the channel structure over the contact metal layer comprises depositing and removing oxide semiconductor layers to form the selected vertical structure as the channel structure over the contact metal layer such that a length of the channel structure in the first direction is greater than the length of the channel region.

4. The method of claim 1, wherein the channel region comprises Indium Gallium Zinc Oxide (IGZO).

5. The method of claim 1, wherein depositing and removing oxide semiconductor layers to form the selected vertical structure as the channel structure over the contact metal layer comprises depositing and removing oxide semiconductor layers to form the selected vertical structure as the channel structure over the contact metal layer such that a diameter of the channel region along the first direction is less than a diameter of each of the two source/drain regions along the first direction.

6. The method of claim 1, wherein removing gate material to form the selected gate structure comprises removing gate material to form the selected gate structure such that the dielectric layer, the channel structure, and the gate structure terminate at a same plane extending orthogonally to the first direction.

7. A method of forming a semiconductor device, comprising:
   forming a contact metal layer;
   forming a channel structure on the contact metal layer, wherein the channel structure comprises a first source/drain region, a channel region and a second source/drain region stacked in that order; and
   forming a gate structure around the channel region, such that an upper surface of the gate structure is substantially coplanar with an upper surface of the channel structure.

8. The method of claim 7, wherein the forming of the channel structure comprises:
   forming a first oxide semiconductor layer on the contact metal layer;
   forming a second oxide semiconductor layer on the first oxide semiconductor layer;
   forming a third oxide semiconductor layer on the second oxide semiconductor layer; and
   etching the first oxide semiconductor layer, the second oxide semiconductor layer, and the third oxide semiconductor layer to form the first source/drain region, the channel region and the second source/drain region, respectively.

9. The method of claim 7, wherein the forming of the channel structure comprises forming the channel structure to have a cylindrical shape extending lengthwise in a first direction perpendicular to the contact metal layer.

10. The method of claim 9, wherein a cross-sectional shape of the channel structure comprises one of a circle, a square, a rectangle or an oval.

11. The method of claim 7, further comprising:
    forming a dielectric layer on the channel structure, wherein the forming of the gate structure comprises forming the gate structure on the dielectric layer.

12. The method of claim 11, wherein the forming of the dielectric layer comprises forming the dielectric layer on the contact metal layer, and the forming of the gate structure comprises forming the gate structure on the dielectric layer such that the dielectric layer is between the gate structure and the contact metal layer.

13. The method of claim 11, wherein the forming of the dielectric layer comprises forming the dielectric layer on the upper surface of the channel structure.

14. The method of claim 13, wherein the forming of the gate structure comprises:
    forming the gate structure to have a height greater than a height of the channel structure; and
    planarizing the gate structure and the dielectric layer such that the upper surface of the gate structure and an upper surface of the dielectric layer are substantially coplanar with the upper surface of the channel structure.

15. The method of claim 13, wherein the forming of the gate structure comprises:
    forming the gate structure to have a height greater than a height of the channel structure; and
    planarizing the gate structure such that the upper surface of the gate structure is substantially coplanar with the upper surface of the channel structure, wherein an upper surface of the dielectric layer is above the upper surface of the channel structure.

16. The method of claim 11, further comprising:
    forming a spacer oxide layer on the contact metal layer, wherein the forming of the dielectric layer comprises forming the dielectric layer on the spacer oxide layer.

17. The method of claim 16, further comprising:
    etching the gate structure on a first side of the channel structure to expose a surface of the dielectric layer;
    forming an interlayer dielectric layer on the gate structure, the channel structure and surface of the dielectric layer;
    forming a first contact in the interlayer dielectric layer, wherein the first contact contacts the gate structure on a second side of the channel structure opposite the first side; and
    forming a second contact in the interlayer dielectric layer, wherein the second contact contacts the second source/drain region.

18. The method of claim 17, further comprising:
    forming a third contact in the interlayer dielectric layer, the dielectric layer and the spacer oxide layer, wherein the third contact contacts the contact metal layer.

19. The method of claim 17, further comprising:
    forming a dielectric underlayer, wherein the forming of the contact metal layer comprises forming the contact metal layer on the dielectric underlayer; and
    forming a third contact in the dielectric underlayer, wherein the third contact contacts the contact metal layer.

20. A method of forming a semiconductor device, comprising:
    forming a transistor, comprising:
      a contact metal layer;
      a channel structure on the contact metal layer, wherein the channel structure comprises a first source/drain region, a channel region and a second source/drain region stacked in that order; and
      a gate structure around the channel region, such that an upper surface of the gate structure is substantially coplanar with an upper surface of the channel structure; and
    forming a memory element on the transistor and connected to the transistor in series.

* * * * *